(12) United States Patent
Sato

(10) Patent No.: US 8,953,143 B2
(45) Date of Patent: Feb. 10, 2015

(54) LIQUID IMMERSION MEMBER

(75) Inventor: Shinji Sato, Fukuya (JP)

(73) Assignee: Nikon Corporation, Tokyo (JP)

( * ) Notice: Subject to any disclaimer, the term of this patent is extended or adjusted under 35 U.S.C. 154(b) by 691 days.

(21) Appl. No.: 12/765,410

(22) Filed: Apr. 22, 2010

(65) Prior Publication Data

US 2010/0283980 A1 Nov. 11, 2010

Related U.S. Application Data

(60) Provisional application No. 61/202,983, filed on Apr. 24, 2009, provisional application No. 61/202,984, filed on Apr. 24, 2009.

(51) Int. Cl.
G03B 27/52 (2006.01)
G03F 7/20 (2006.01)

(52) U.S. Cl.
CPC .................................. *G03F 7/70341* (2013.01)
USPC ................................................ 355/30; 355/53

(58) Field of Classification Search
CPC ............ G03F 7/70341; G03F 7/70716; G03F 7/2041; G03F 7/70325
USPC ..................................................... 355/30, 53
See application file for complete search history.

(56) References Cited

U.S. PATENT DOCUMENTS

| 6,208,407 B1 | 3/2001 | Loopstra |
| 6,262,796 B1 | 7/2001 | Loopstra et al. |
| 6,341,007 B1 | 1/2002 | Nishi et al. |
| 6,400,441 B1 | 6/2002 | Nishi et al. |
| 6,452,292 B1 | 9/2002 | Binnard |
| 6,549,269 B1 | 4/2003 | Nishi et al. |
| 6,590,634 B1 | 7/2003 | Nishi et al. |
| 6,611,316 B2 | 8/2003 | Sewell |
| 6,778,257 B2 | 8/2004 | Bleeker et al. |
| 6,897,963 B1 | 5/2005 | Taniguchi et al. |
| 7,023,610 B2 | 4/2006 | Ohtsuki et al. |

(Continued)

FOREIGN PATENT DOCUMENTS

| EP | 1 528 432 A1 | 5/2005 |
| EP | 1 610 361 A1 | 12/2005 |

(Continued)

OTHER PUBLICATIONS

International Search Report mailed on Aug. 6, 2010 issued in International Patent Application No. PCT/JP2010/057737.

(Continued)

*Primary Examiner* — Mesfin T Asfaw
(74) *Attorney, Agent, or Firm* — Oliff PLC

(57) ABSTRACT

A liquid immersion member is disposed around an optical member having an emergent surface from at least part of which exposure light is emitted and which holds a liquid between itself and an object opposing the emergent surface so that an optical path of exposure light between the emergent surface and the object is filled with a liquid to form an immersion space. The liquid immersion member comprises: an opening that recovers a liquid on the object with a gas; a space into which the liquid and the gas from the opening are entered; a recovery passageway into which only a liquid in the space is entered; an inner side surface that opposes at least part of a side surface of the optical member with a gap therebetween; and a recovery port that recovers at least part of a liquid in the gap.

14 Claims, 13 Drawing Sheets

(56) References Cited

U.S. PATENT DOCUMENTS

| | | | |
|---|---|---|---|
| 7,292,313 | B2 | 11/2007 | Poon et al. |
| 7,471,371 | B2 | 12/2008 | Kameyama |
| 8,004,651 | B2 | 8/2011 | Nagasaka |
| 8,134,685 | B2 | 3/2012 | Nishii et al. |
| 2005/0018155 | A1* | 1/2005 | Cox et al. .................. 355/30 |
| 2006/0012765 | A1 | 1/2006 | Kameyama |
| 2006/0152697 | A1 | 7/2006 | Poon et al. |
| 2007/0008507 | A1* | 1/2007 | Kono et al. ................ 355/53 |
| 2007/0177125 | A1 | 8/2007 | Shibazaki |
| 2008/0043211 | A1* | 2/2008 | Poon et al. ................ 355/30 |
| 2008/0068570 | A1 | 3/2008 | Streefkerk et al. |
| 2008/0218714 | A1* | 9/2008 | Uehara et al. ............. 355/53 |
| 2008/0226332 | A1 | 9/2008 | Fujiwara |
| 2008/0231824 | A1 | 9/2008 | Nagasaka |
| 2008/0233512 | A1 | 9/2008 | Nishii et al. |
| 2010/0045950 | A1 | 2/2010 | Kemper et al. |

FOREIGN PATENT DOCUMENTS

| | | |
|---|---|---|
| EP | 1 736 831 A1 | 12/2006 |
| EP | 1 873 815 A1 | 1/2008 |
| EP | 1 903 398 A1 | 3/2008 |
| EP | 1 926 127 A1 | 5/2008 |
| EP | 1 962 328 A1 | 8/2008 |
| EP | 2 042 930 A2 | 4/2009 |
| JP | A-2008-078648 | 4/2008 |
| WO | WO 01/35168 A1 | 5/2001 |
| WO | WO 2004/019128 A2 | 3/2004 |
| WO | WO 2004/086470 A1 | 10/2004 |
| WO | WO 2006/106907 A1 | 10/2006 |
| WO | WO 2007/023813 A1 | 3/2007 |
| WO | WO 2007/055373 A1 | 5/2007 |
| WO | WO 2008/143357 A1 | 11/2008 |

OTHER PUBLICATIONS

Written Opinion mailed on Aug. 6, 2010 issued in International Patent Application No. PCT/JP2010/057737.

Japanese Patent Office, Notice of Reasons for Rejection mailed Jul. 2, 2013 in Japanese Patent Application No. 2011-545568 w/English-language Translation.

* cited by examiner

LIQUID IMMERSION MEMBER

CROSS-REFERENCE TO RELATED APPLICATION

This application is a non-provisional application claiming priority to and the benefit of U.S. provisional application Nos. 61/202,983 and 61/202,984, filed Apr. 24, 2009. The entire contents of which are incorporated herein by reference.

BACKGROUND

The present invention relates to a liquid immersion member.

As disclosed, for example, in U.S. Patent Application Publication No. 2008/0233512 and U.S. Patent Application Publication No. 2006/0152697, among exposure apparatuses used in photolithography, an immersion exposure apparatus that exposes a substrate with exposure light through a liquid is known. The immersion exposure apparatus fills an optical path of the exposure light with the liquid by performing a liquid supply operation and a liquid recovery operation.

SUMMARY

In an immersion exposure apparatus, if an object (e.g., a substrate to be exposed), whereon an immersion space (i.e., an immersion area) is formed, is moved at high speed, then, for example, the liquid might leak, or a film, a drop, or the like of the liquid might remain on the object. Furthermore, in an immersion exposure apparatus, if the liquid on the substrate is recovered via a porous member, then the surface (i.e., the lower surface) of the porous member that opposes the substrate may become contaminated. As a result, contaminants (i.e., foreign matter) might adhere to the substrate and the supplied liquid might become contaminated. If such problems arise, then exposure failures, such as defects in the pattern formed on the substrate, might occur. These potential problems could also result in the production of defective devices.

An object of the present invention is to provide a liquid immersion member that can prevent exposure failures from occurring.

A first aspect of the invention provides a liquid immersion member which is disposed around an optical member having an emergent surface from at least part of which exposure light is emitted and which holds a liquid between itself and an object opposing the emergent surface so that an optical path of exposure light between the emergent surface and the object is filled with a liquid to form an immersion space, the liquid immersion member comprising: an opening that recovers a liquid on the object with a gas; a space into which the liquid and the gas from the opening are entered; a recovery passageway into which only a liquid in the space is entered; an inner side surface that opposes at least part of a side surface of the optical member with a gap therebetween; and a recovery port that recovers at least part of a liquid in the gap.

A second aspect of the invention provides a liquid immersion member which is disposed around an optical member having an emergent surface from at least part of which exposure light is emitted and which holds a liquid between itself and an object opposing the emergent surface so that an optical path of exposure light between the emergent surface and the object is filled with a liquid to form an immersion space, the liquid immersion member comprising: an opening that recovers a liquid on the object with a gas; a space into which the liquid and the gas from the opening are entered; a recovery passageway into which only a liquid in the space is entered; an inner side surface that opposes at least part of a side surface of the optical member with a gap therebetween; and a recovery port that recovers at least one of a gas and a liquid in the gap.

A third aspect of the invention provides a liquid immersion member which is disposed around an optical member having an emergent surface from at least part of which exposure light is emitted and which holds a liquid between itself and an object opposing the emergent surface so that an optical path of exposure light between the emergent surface and the object is filled with a liquid to form an immersion space, the liquid immersion member comprising: an opening that recovers a liquid on the object with a gas; a space into which the liquid and the gas from the opening are entered; a recovery passageway into which only a liquid in the space is entered; an inner side surface that opposes at least part of a side surface of the optical member with a gap therebetween; and a supply port that supplies a gas to the gap.

A fourth aspect of the invention provides a liquid immersion member which holds a liquid between an emergent surface of an optical member from which exposure light is emitted and an object facing the emergent surface so that an optical path of exposure light between the emergent surface and the object is filled with a liquid to form an immersion space, the liquid immersion member comprising: an opening that recovers a liquid on the object with a gas; a space into which the liquid and the gas from the opening are entered; a recovery passageway into which only a liquid in the space is entered; and a supply port that supplies a gas, which has been humidified, to an interface of a liquid in the immersion space.

A fifth aspect of the invention provides a liquid immersion member which holds a liquid between an emergent surface of an optical member from which exposure light is emitted and an object facing the emergent surface so that an optical path of exposure light between the emergent surface and the object is filled with a liquid to form an immersion space, the liquid immersion member comprising: an opening that recovers a liquid on the object with a gas; a space into which the liquid and the gas from the opening are entered; a recovery passageway into which only a liquid in the space is entered; and a supply port that supplies a liquid to the space.

A sixth aspect of the invention provides a liquid immersion member which holds a liquid between an emergent surface of an optical member from which exposure light is emitted and an object facing the emergent surface so that an optical path of exposure light between the emergent surface and the object is filled with a liquid to form an immersion space, the liquid immersion member comprising: an opening that recovers a liquid on the object with a gas; a space into which the liquid and the gas from the opening are entered; a recovery passageway into which only a liquid in the space is entered; and a lower surface that is disposed at least partly around the opening so that the object opposes the lower surface, wherein the lower surface comprises a fluorinated member.

A seventh aspect of the invention provides a liquid immersion member which holds a liquid between an emergent surface of an optical member from which exposure light is emitted and an object facing the emergent surface so that an optical path of exposure light between the emergent surface and the object is filled with a liquid to form an immersion space, the liquid immersion member comprising: a space into which a liquid on the object together with a liquid is entered via a first porous member; a recovery passage into which a liquid from the space is entered; and a second porous member that allows substantially only a liquid from the space to enter into the recovery passage.

A eighth aspect of the invention provides a liquid immersion member which holds a liquid between an emergent surface of an optical member from which exposure light is emitted and an object facing the emergent surface so that an optical path of exposure light between the emergent surface and the object is filled with a liquid to form an immersion space, the liquid immersion member comprising: a recovery portion that has a plurality of openings and that recovers a liquid on the object with a gas; a space into which the liquid and the gas from the recover portion are entered; and a recovery passageway into which only a liquid in the space is entered, wherein the space can be opened to an atmosphere via at least part of holes.

DESCRIPTION OF EMBODIMENTS

The following text explains the embodiments of the present invention, referencing the drawings; however, the present invention is not limited thereto. The explanation below defines an XYZ orthogonal coordinate system, and the positional relationships among parts are explained referencing this system. Prescribed directions within the horizontal plane are the X axial directions, directions orthogonal to the X axial directions in the horizontal plane are the Y axial directions, and directions orthogonal to the X axial directions and the Y axial directions (i.e., the vertical directions) are the Z axial directions. In addition, the rotational directions (i.e., the tilting directions) around the X, Y, and Z axes are the $\theta X$, $\theta Y$, and $\theta Z$ directions, respectively.

<First Embodiment>

Figure 1:
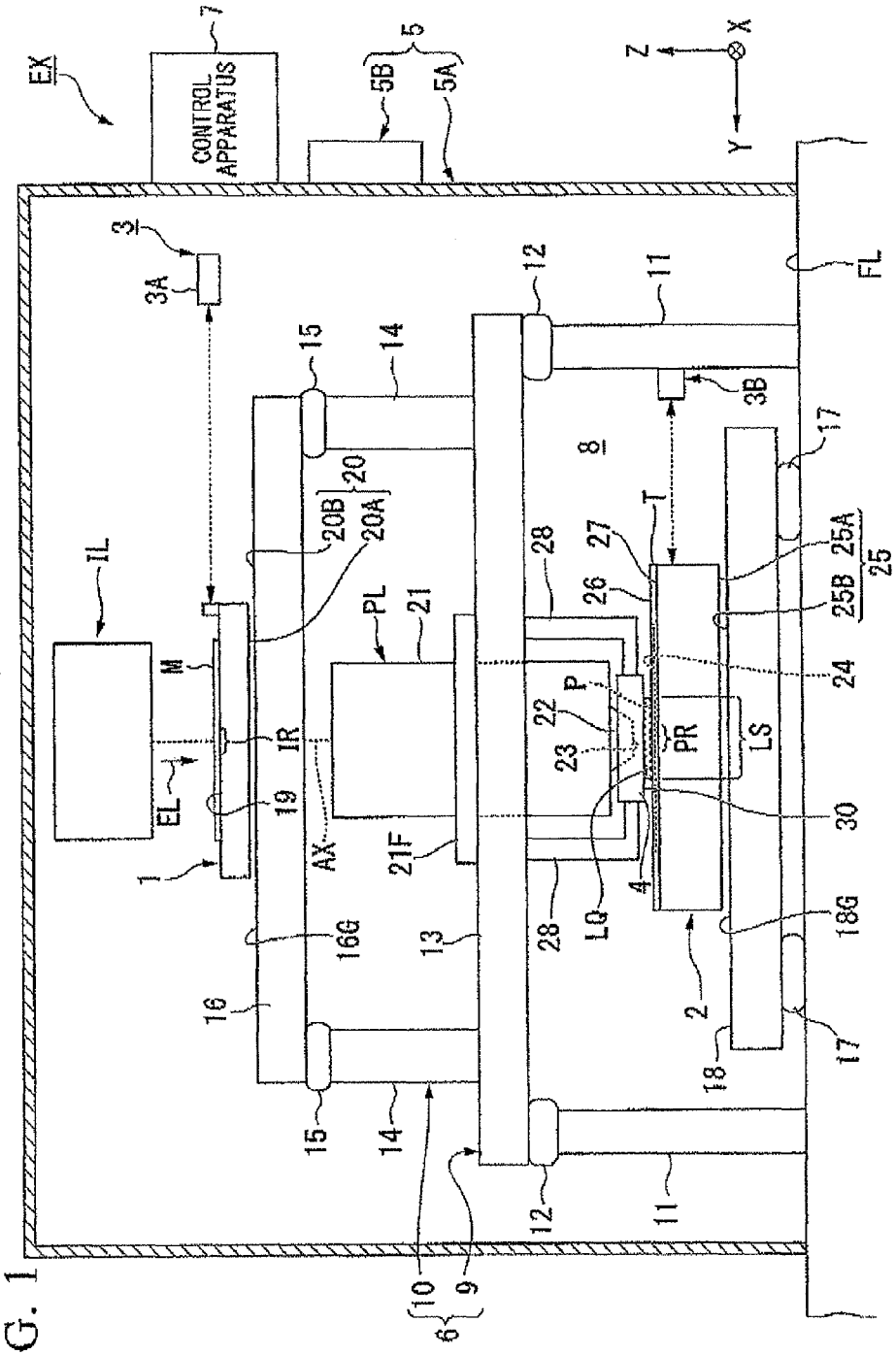
FIG. 1 is a schematic block diagram that shows one example of an exposure apparatus according to a first embodiment.

A first embodiment will now be explained. FIG. 1 is a schematic block diagram that shows one example of an exposure apparatus EX according to a first embodiment. The exposure apparatus EX of the present embodiment is an immersion exposure apparatus that exposes a substrate P with exposure light EL that passes through a liquid LQ. In the present embodiment, water (i.e., pure water) is used as the liquid LQ.

In FIG. 1, the exposure apparatus EX comprises: a movable mask stage 1, which holds a mask M; a movable substrate stage 2, which holds the substrate P; an interferometer system 3, which optically measures the positions of the mask stage 1 and the substrate stage 2; an illumination system IL, which illuminates the mask M with the exposure light EL; a projection optical system PL that projects an image of a pattern of the mask M, which is illuminated by the exposure light EL, to the substrate P; a liquid immersion member 4, which is capable of forming an immersion space LS such that at least part of an optical path of the exposure light EL is filled with the liquid LQ; a chamber apparatus 5, which houses at least the projection optical system PL and the substrate stage 2; a body 6, which supports at least the projection optical system PL; and a control apparatus 7, which controls the operation of the entire exposure apparatus EX.

The mask M is a reticle on which a device pattern to be projected to the substrate P is formed. The mask M is a transmissive mask comprising a transparent plate, such as a glass plate, and the pattern, which is formed on the transparent plate using a shielding material, such as chrome. Furthermore, the mask M may alternatively be a reflective mask.

The substrate P is a substrate for fabricating devices. The substrate P comprises a base material (e.g., a semiconductor wafer) and a multilayer film that is formed thereon. The multilayer film is a film wherein a plurality of films, including at least a photosensitive film, is layered. The photosensitive film is a film that is formed from a photosensitive material. In addition, the multilayer film may include, for example, an antireflection film and a protective film (i.e., a topcoat film) that protects the photosensitive film.

The chamber apparatus 5 comprises a chamber member 5A, which forms a substantially closed internal space 8, and an environmental control apparatus 5B, which controls the environment (i.e., the temperature, the humidity, the cleanliness level, the pressure, and the like) of the internal space 8. The substrate stage 2 moves within the internal space 8. The chamber apparatus 5 adjusts the environment of the space (i.e., the internal space 8) within which at least the substrate stage 2 moves.

In the present embodiment, the body 6 is disposed in the internal space 8. The body 6 comprises a first columnar structure 9, which is provided on a support surface FL, and a second columnar structure 10, which is provided on the first columnar structure 9. The first columnar structure 9 comprises first support members 11 and a first base plate 13, which is supported by the first support members 11 via vibration isolating apparatuses 12. The second columnar structure 10 comprises second support members 14, which are provided on the first base plate 13, and a second base plate 16, which is supported by the second support members 14 via vibration isolating apparatuses 15. In addition, in the present embodiment, a third base plate 18 is disposed on the support surface FL via vibration isolating apparatuses 17.

The illumination system IL radiates the exposure light EL to a prescribed illumination area IR. The illumination area IR includes a position whereto the exposure light EL that emerges from the illumination system IL can be radiated. The illumination system IL illuminates at least part of the mask M disposed in the illumination area IR with the exposure light EL, which has a uniform luminous flux intensity distribution. Examples of light that can be used as the exposure light EL emitted from the illumination system IL include: deep ultraviolet (DUV) light, such as a bright line (i.e., g-line, h-line, or i-line) light emitted from, for example, a mercury lamp, and KrF excimer laser light (with a wavelength of 248 nm); and vacuum ultraviolet (VUV) light, such as ArF excimer laser light (with a wavelength of 193 nm) and $F_2$ laser light (with a wavelength of 157 nm). In the present embodiment, ArF excimer laser light, which is ultraviolet light (e.g., vacuum ultraviolet light), is used as the exposure light EL.

The mask stage 1 comprises a mask holding part 19, which releasably holds the mask M, and is capable of moving on a guide surface 16G of a second base plate 16 in the state wherein the mask stage 1 holds the mask M. The mask stage 1 is capable of holding the mask M and moving the mask M with respect to the illumination area IR by the operation of a drive system 20. The drive system 20 comprises a planar motor that comprises a slider 20A, which is disposed on the mask stage 1, and a stator 20B, which is disposed on the second base plate 16. A planar motor that is capable of moving the mask stage 1 is disclosed in, for example, U.S. Pat. No. 6,452,292. The mask stage 1 is capable of moving in six directions, namely, the X axial, Y axial, Z axial, θX, θY, and θZ directions, by the operation of the drive system 20.

The projection optical system PL radiates the exposure light EL to a prescribed projection area PR. The projection optical system PL projects with a prescribed projection magnification an image of the pattern of the mask M to at least part of the substrate P, which is disposed in the projection area PR. The projection optical system PL of the present embodiment is a reduction system that has a projection magnification of, for example, ¼, ⅕, or ⅛. Furthermore, the projection optical system PL may be a unity magnification system or an enlargement system. In the present embodiment, an optical axis AX of the projection optical system PL is parallel to the Z axis. In addition, the projection optical system PL may be a dioptric system that does not include catoptric elements, a catoptric system that does not include dioptric elements, or a catadioptric system that includes both catoptric and dioptric elements. In addition, the projection optical system PL may form either an inverted or an erect image.

A holding member 21 (i.e., a lens barrel) holds a plurality of optical elements of the projection optical system PL. The holding member 21 has a flange 21F. The first base plate 13 supports the projection optical system PL via the flange 21F. Furthermore, a vibration isolating apparatus can be provided between the first base plate 13 and the holding member 21.

The projection optical system PL has an emergent surface 23 wherefrom the exposure light EL emerges and travels toward an image plane of the projection optical system PL. The emergent surface 23 is disposed in a last optical element 22, which is the optical element of the plurality of optical elements of the projection optical system PL that is closest to the image plane of the projection optical system PL. The projection area PR includes a position whereto the exposure light EL that emerges from the emergent surface 23 can be radiated. In the present embodiment, the emergent surface 23 faces the −Z direction and is parallel to the XY plane. Furthermore, the emergent surface 23, which faces the −Z direction, may be a convex or a concave surface.

In the present embodiment, the optical axis AX (i.e., the optical axis in the vicinity of the image plane of the projection optical system PL) of the last optical element 22 is substantially parallel to the Z axis. Furthermore, the optical axis defined by the optical element adjacent to the last optical element 22 may be regarded as the optical axis of the last optical element 22. In addition, in the present embodiment, the image plane of the projection optical system PL is substantially parallel to the XY plane, which includes the X axis and the Y axis. In addition, in the present embodiment, the image plane is substantially horizontal. However, the image plane does not have to be parallel to the XY plane and may be a curved surface.

The substrate stage 2 comprises a substrate holding part 24, which releasably holds the substrate P, and is capable of moving on a guide surface 18G of a third base plate 18. The substrate stage 2 is capable of holding the substrate P and moving the substrate P with respect to the projection area PR by the operation of a drive system 25. The drive system 25 comprises a planar motor that comprises a slider 25A, which is disposed on the substrate stage 2, and a stator 25B, which is disposed on the third base plate 18. A planar motor that is capable of moving the substrate stage 2 is disclosed in, for example, U.S. Pat. No. 6,452,292. The substrate stage 2 is capable of moving in six directions, namely, the X axial, Y axial, Z axial, θX, θY, and θZ directions, by the operation of the drive system 25.

The substrate stage 2 has an upper surface 26, which is disposed around the substrate holding part 24 and is capable of opposing the emergent surface 23. In the present embodiment, as disclosed in U.S. Patent Application Publication No. 2007/0177125, the substrate stage 2 comprises a plate member holding part 27, which is disposed at least partly around the substrate holding part 24 and releasably holds a lower surface of a plate member T. In the present embodiment, the upper surface 26 of the substrate stage 2 includes an upper surface of the plate member T. The upper surface 26 is flat.

In the present embodiment, the substrate holding part 24 is capable of holding the substrate P such that a front surface of the substrate P is substantially parallel to the XY plane. The plate member holding part 27 is capable of holding the plate member T such that the upper surface 26 of the plate member T is substantially parallel to the XY plane. Furthermore, the plate member T does not have to be capable of being released from the substrate stage 2. In such a case, the plate member holding part 27 could be omitted.

The interferometer system 3 comprises a first interferometer unit 3A, which is capable of optically measuring the position of the mask stage 1 (i.e., the mask M) within the XY plane, and a second interferometer unit 3B, which is capable of optically measuring the position of the substrate stage 2 (i.e., the substrate P) within the XY plane. When an exposing process or a prescribed measuring process is performed on the substrate P, the control apparatus 7 controls the positions of the mask stage 1 (i.e., the mask M) and the substrate stage 2 (i.e., the substrate P) by operating the drive systems 20, based on the measurement results of the interferometer system 3.

The liquid immersion member 4 is disposed at least partly around the optical path of the exposure light EL. In the present embodiment, at least part of the liquid immersion member 4 is disposed at least partly around the last optical element 22. The liquid immersion member 4 has a lower surface 30 that is capable of opposing a front surface (i.e., an upper surface) of an object, which is disposed at a position at which it opposes the emergent surface 23. The liquid immersion member 4 forms the immersion space LS such that the optical path of the exposure light EL between the emergent surface 23 and the object, which is disposed at a position at which it opposes the emergent surface 23, is filled with the liquid LQ. Some of the liquid LQ that forms the immersion space LS is held between the front surface (i.e., the upper surface) of the object and at least part of the lower surface 30.

The immersion space LS is a portion (i.e., a space or an area) that is filled with the liquid LQ. In the present embodiment, the object, which is capable of moving to a position at which it opposes the emergent surface 23, includes either the substrate stage 2 (i.e., the plate member T) or the substrate P, which is held by the substrate stage 2, or both. During an exposure of the substrate P, the liquid immersion member 4 forms the immersion space LS such that the optical path of the exposure light EL between the last optical element 22 and the substrate P is filled with the liquid LQ.

In the present embodiment, the liquid immersion member 4 is supported by support mechanisms 28. In the present embodiment, the first base plate 13 supports the support mechanisms 28. In the present embodiment, the liquid immersion member 4 is suspended from the first base plate 13 via the support mechanisms 28.

The exposure apparatus EX of the present embodiment is a scanning type exposure apparatus (i.e., a so-called scanning stepper) that projects the image of the pattern of the mask M to the substrate P while synchronously moving the mask M and the substrate P in prescribed scanning directions. When the substrate P is exposed, the control apparatus 7 controls the mask stage 1 and the substrate stage 2 so as to move the mask M and the substrate P in the prescribed scanning directions within the XY plane that intersects the optical axis AX (i.e., the optical path of the exposure light EL). In the present embodiment, the scanning directions (i.e., the synchronous movement directions) of both the substrate P the mask M are the Y axial directions. The control apparatus 7 radiates the exposure light EL to the substrate P through the projection optical system PL and the liquid LQ in the immersion space LS on the substrate P while moving the substrate P in one of the Y axial directions with respect to the projection area PR of the projection optical system PL and moving the mask M, synchronized to the movement of the substrate P, in the other Y axial direction with respect to the illumination area IR of the illumination system IL. Thereby, the image of the pattern of the mask M is projected to the substrate P, which is thereby exposed by the exposure light EL.

Figure 2:
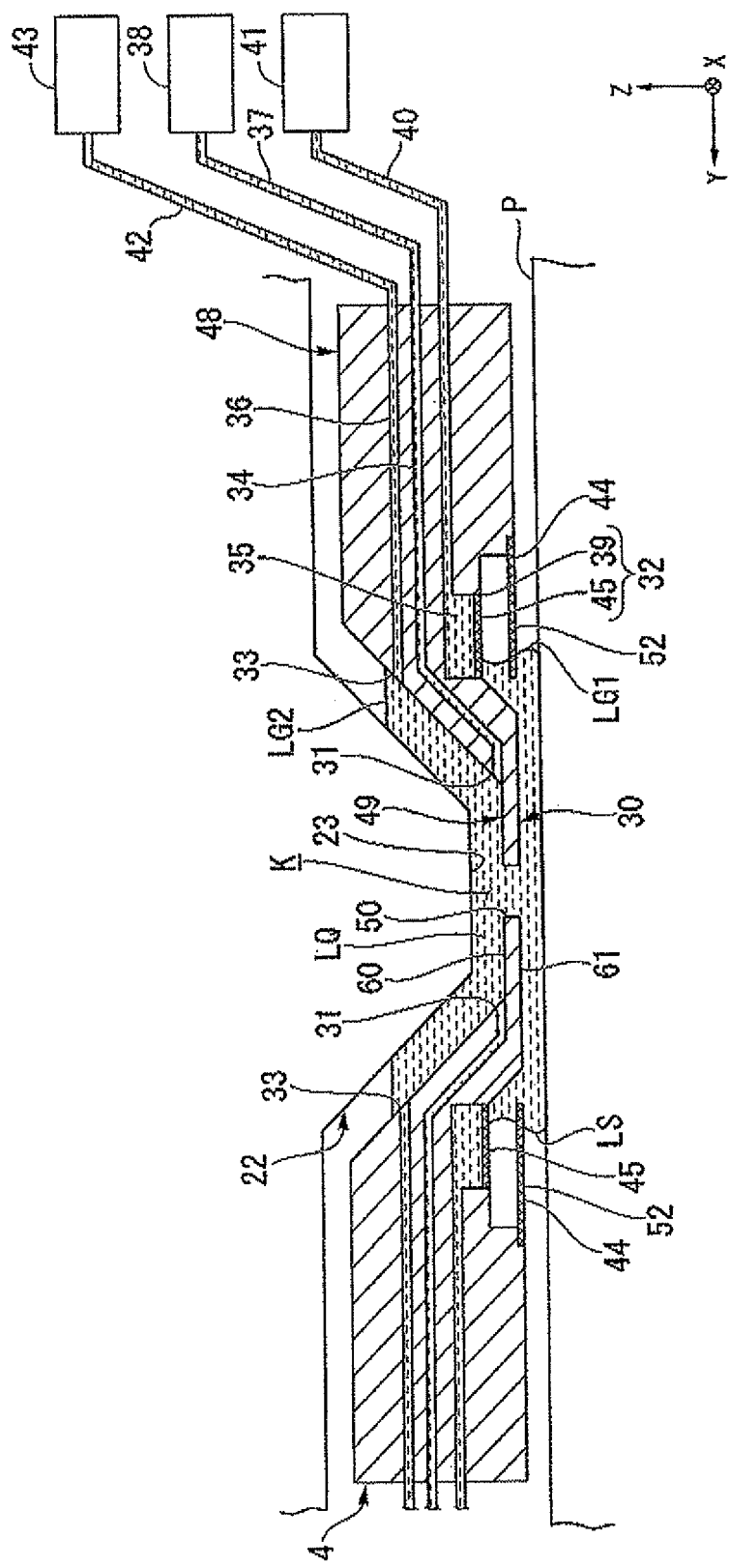
FIG. 2 is a partial enlarged view of the exposure apparatus according to the first embodiment.
Figure 3:
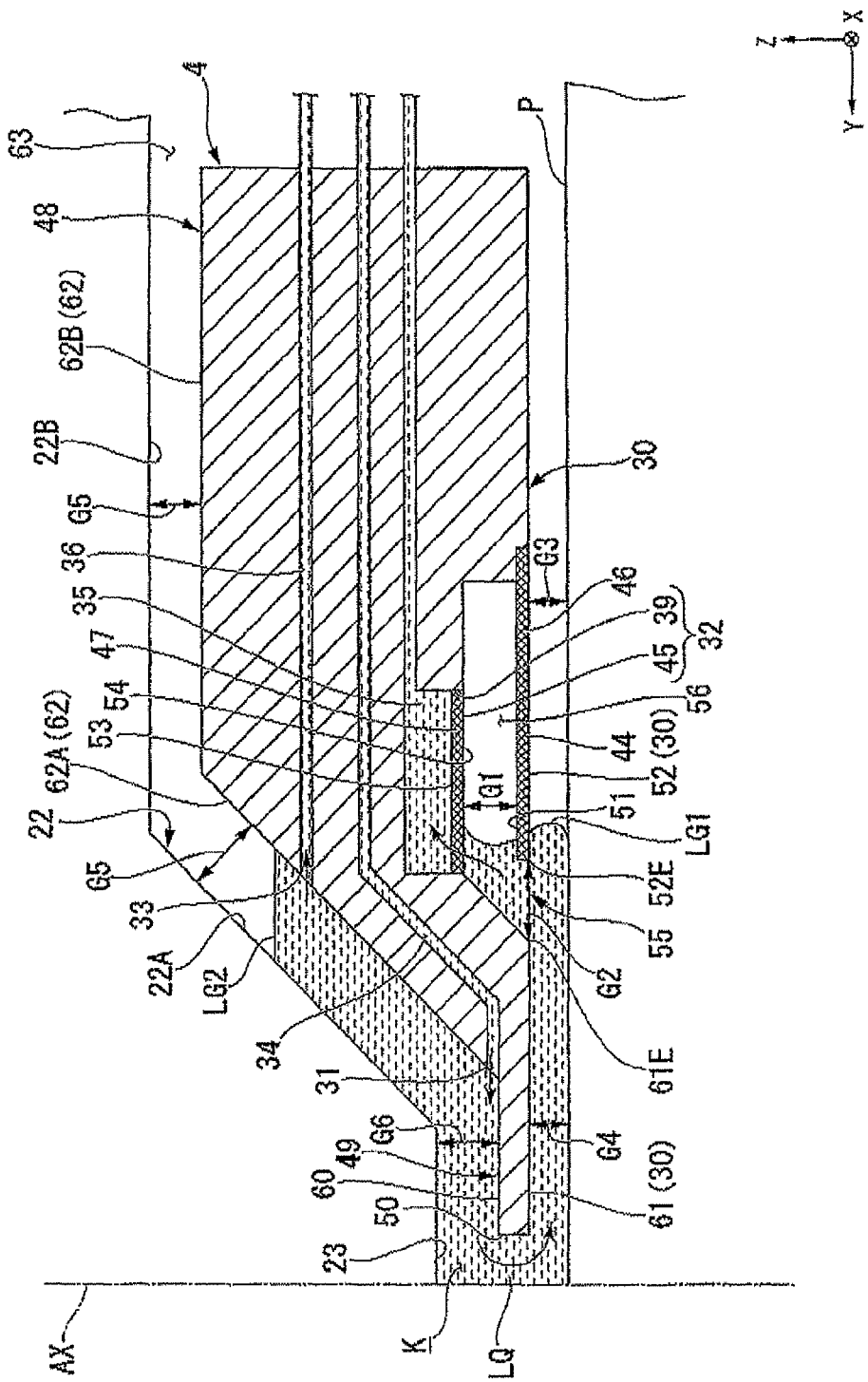
FIG. 3 shows the vicinity of a liquid immersion member according to the first embodiment.

The following text explains the liquid immersion member 4, referencing FIG. 2 and FIG. 3. FIG. 2 is a side cross sectional view that shows the vicinity of the liquid immersion member 4, and FIG. 3 is a partial enlarged view of FIG. 2. Furthermore, in the examples shown in FIG. 2 and FIG. 3, the object that is disposed below the liquid immersion member 4 such that it opposes the emergent surface 23 and the lower surface 30 is the substrate P.

For the sake of simplicity, the following text explains an exemplary case wherein the substrate P is disposed at a position at which it opposes the emergent surface 23 and the lower surface 30, the liquid LQ is held between the liquid immersion member 4 and the substrate P, and the immersion space LS is thereby formed. Furthermore, as discussed above, the immersion space LS can be formed between the emergent surface 23 and the liquid immersion member 4 on one side and another member (e.g., the plate member T of the substrate stage 2) on the other side.

At least part of the liquid immersion member 4 is disposed around part of an optical path K of the exposure light EL and around the last optical element 22. In the present embodiment, the liquid immersion member 4 is a ring shaped member. In the present embodiment, the external shape of the liquid immersion member 4 within the XY plane is a circle. Furthermore, the external shape of the liquid immersion member 4 may be some other shape (e.g., a rectangle).

In the present embodiment, the liquid immersion member 4 comprises: supply ports 31, which supply the liquid LQ to the optical path K of the exposure light EL emerging from the emergent surface 23 of the last optical element 22; a liquid recovery part 32, which is disposed at least partly around the optical path K and is capable of recovering the liquid LQ; and recovery ports 33, which are disposed at least partly around the optical path K and are capable of recovering the liquid LQ.

In addition, the liquid immersion member 4 comprises: supply passageways 34, which supply the liquid LQ to the supply ports 31; the recovery passageway 35, which recover the liquid LQ from the liquid recovery part 32; and recovery passageways 36, which recover the liquid LQ from the recovery ports 33. The supply passageways 34, the recovery passageway 35, and the recovery passageways 36 are formed inside the liquid immersion member 4. Each of the supply ports 31 is disposed at one end of the corresponding supply passageway 34. The liquid recovery part 32 is disposed at one end of the recovery passageway 35. Each of the recovery ports 33 is disposed at one end of the corresponding recovery passageway 36.

The supply ports 31 are connected to a liquid supply apparatus 38 via the supply passageways 34 and a supply pipe passageway 37. The liquid supply apparatus 38 can supply the liquid LQ, which is clean and temperature adjusted, to the supply ports 31.

The liquid recovery part 32 has a recovery port 39. The recovery port 39 is connected to a liquid recovery apparatus 41 via the recovery passageway 35 and a recovery pipe passageway 40. The liquid recovery apparatus 41 comprises a pressure adjusting apparatus and is capable of adjusting the pressure in the recovery passageway 35 via the passageway 40. In the present embodiment, the liquid recovery apparatus 41 comprises a vacuum system (such as a valve that controls the connection state between a vacuum source and a recovery port) and is capable of adjusting the pressure in the recovery passageway 35 to a prescribed negative pressure. The liquid recovery apparatus 41 is capable of recovering the liquid LQ from the liquid recovery part 32 by negatively pressurizing the recovery passageway 35 and thereby suctioning the liquid LQ therefrom. The liquid LQ recovered from the liquid recovery part 32 is recovered by the liquid recovery apparatus 41 through the recovery passageway 35 and the passageway 40.

The recovery ports 33 are connected to a liquid recovery apparatus 43 via the recovery passageways 36 and a recovery pipe passageway 42. The liquid recovery apparatus 43 comprises a vacuum system (such as a valve that controls the connection state between a vacuum source and a recovery port) and is capable of recovering the liquid LQ via the recovery ports 33 by suctioning the liquid LQ.

In the present embodiment, the liquid immersion member 4 comprises a first porous member 44 and a second porous member 45. The first porous member 44 is disposed at a position at which it is capable of opposing the substrate P. The second porous member 45 is disposed in the recovery port 39. In the present embodiment, the liquid recovery part 32 has the recovery port 39 and comprises the second porous member 45, which is disposed in the recovery port 39.

The first porous member 44 has: a first surface 51; a second surface 52, which faces a direction other than that faced by the first surface 51; and a plurality of holes 46, which connect the first surface 51 and the second surface 52. The second porous member 45 has: a third surface 53; a fourth surface 54, which faces a direction other than that faced by the third surface 53; and a plurality of holes 47, which connect the third surface 53 and the fourth surface 54.

The first porous member 44 is disposed in the liquid immersion member 4 such that the substrate P (i.e., the object) faces the second surface 52. The liquid immersion member 4 supports at least part of the first porous member 44.

The second porous member 45 is disposed such that the third surface 53 faces the recovery passageway 35. The liquid immersion member 4 supports at least part of the second porous member 45.

In the present embodiment, the second porous member 45 is disposed such that at least part of the fourth surface 54 opposes the first surface 51 of the first porous member 44 across a first gap G1.

In the present embodiment, the first porous member 44 is a plate shaped member wherein the plurality of the small holes 46 is formed. The first porous member 44 is a member that is made by fabricating a plate member (i.e., a base material) and forming the plurality of the holes 46 therein and is also called a mesh plate. In the present embodiment, the first porous member 44 is made of titanium. Furthermore, the first porous member 44 may be made of stainless steel.

In the present embodiment, the first surface 51 faces the upward direction (i.e., the +Z direction) such that it opposes the fourth surface 54 across the first gap G1. The second surface 52 faces the direction opposite that faced by the first surface 51 (i.e., the −Z direction or the downward direction). Furthermore, in the present embodiment, the upward direction is parallel to the optical axis AX and is the opposite direction of that in which the exposure light EL travels. The downward direction is parallel to the optical axis AX and is the direction in which the exposure light EL travels.

In the present embodiment, the first surface 51 and the second surface 52 are substantially parallel. In the present embodiment, the first surface 51 and the second surface 52 are substantially parallel to the front surface of the substrate P (i.e., to the XY plane).

Furthermore, the first surface 51 and the second surface 52 may be nonparallel. In addition, the first surface 51 may be inclined with respect to the XY plane. Namely, the normal line of the first surface 51 may be nonparallel to the optical axis AX. In addition, the second surface 52 may be inclined with respect to the XY plane. In addition, at least part of the first surface 51 may be a curved surface and at least part of the second surface 52 may be a curved surface.

In the present embodiment, the second porous member 45 is a plate shaped member wherein the plurality of the small holes 47 is formed. In the present embodiment, the second porous member 45 is also called a mesh plate. In the present embodiment, the second porous member 45 is made of titanium. Furthermore, the second porous member 45 may be made of stainless steel.

In the present embodiment, the third surface 53 faces the upward direction (i.e., the +Z direction) such that it faces the recovery passageway 35. The fourth surface 54 faces the direction opposite that faced by the third surface 53 (i.e., the −Z direction or the downward direction). Furthermore, at least part of the fourth surface 54 opposes the first surface 51 across the first gap G1.

In the present embodiment, the third surface 53 and the fourth surface 54 are substantially parallel. In the present embodiment, the third surface 53 and the fourth surface 54 are substantially parallel to the front surface of the substrate P (i.e., to the XY plane).

Furthermore, the third surface 53 and the fourth surface 54 may be nonparallel. In addition, the third surface 53 may be inclined with respect to the XY plane. Namely, the normal line of the third surface 53 may be nonparallel to the optical axis AX. In addition, the fourth surface 54 may be inclined with respect to the XY plane. In addition, at least part of the third surface 53 may be a curved surface and at least part of the fourth surface 54 may be a curved surface.

In the present embodiment, the liquid immersion member 4 comprises a main body part 48, which is disposed around the last optical element 22, and a plate part 49, at least part of which is disposed between the emergent surface 23 of the last optical element 22 and the front surface of the substrate P in the Z axial directions.

The plate part 49 has an opening 50 at a position at which the opening 50 opposes the emergent surface 23. The exposure light EL that emerges from the emergent surface 23 can pass through the opening 50. For example, during an exposure of the substrate P, the exposure light EL that emerges from the emergent surface 23 passes through the opening 50 and is radiated through the liquid LQ to the front surface of the substrate P. In the present embodiment, the opening 50 is long in the X axial directions, which intersect the scanning directions of the substrate P (i.e., the Y axial directions).

The plate part 49 has an upper surface 60, which opposes part of the emergent surface 23, and a lower surface 61, which is capable of opposing the front surface of the substrate P. The upper surface 60 and the lower surface 61 are each disposed around the opening 50. Namely, the upper surface 60 and the lower surface 61 are each disposed around the optical path K of the exposure light EL emerging from the emergent surface 23 of the last optical element 22.

In the present embodiment, the lower surface 30 of the liquid immersion member 4 includes the lower surface 61 of the plate part 49 and the second surface 52 of the first porous member 44. The lower surface 61 of the plate part 49 and the second surface 52 of the first porous member 44 are capable of holding the liquid LQ between themselves and the front surface of the substrate P, which is disposed at a position whereto the exposure light EL that emerges from the last optical element 22 can be radiated. The liquid LQ in the immersion space LS contacts at least the upper surface 60 of the plate part 49 and the lower surface 61 of the plate part 49.

In the present embodiment, the lower surface 61 is a flat surface. In the present embodiment, the lower surface 61 is substantially parallel to the front surface of the substrate P (i.e., to the XY plane). In the present embodiment, the upper surface 60 and the lower surface 61 are substantially parallel. In addition, the emergent surface 23 is substantially parallel to the upper surface 60 and the lower surface 61.

Furthermore, the lower surface 61 may be inclined with respect to the XY plane. In addition, the lower surface 61 and the emergent surface 23 may be nonparallel, the upper surface 60 and the emergent surface 23 may be nonparallel, and the upper surface 60 and the lower surface 61 may be nonparallel. In addition, at least part of the upper surface 60 may be a curved surface, and at least part of the lower surface 61 may be a curved surface. In addition, at least part of the emergent surface 23 may be a curved surface.

In the explanation below, the lower surface 61 is called the liquid contact surface 61 where appropriate. The liquid contact surface 61 is disposed around the optical path K of the exposure light EL emerging from the emergent surface 23.

In the present embodiment, the second surface 52 is disposed in the lower surface 30 of the liquid immersion member 4 at least partly around and spaced apart from the liquid contact surface 61. Namely, the first porous member 44 and the plate part 49 are disposed such that a second gap G2 is formed between an outer side edge 61E of the liquid contact surface 61 and an inner side edge 52E of the second surface 52.

The second gap G2 forms an opening 55 wherethrough the liquid LQ on the substrate P can flow into the first gap G1 between the first porous member 44 and the second porous member 45 without transiting the holes 46 of the first porous member 44. The liquid LQ on the substrate P can flow via the opening 55, which is formed between the liquid contact surface 61 and the second surface 52, into a space 56 (i.e., the first gap G1) between the first porous member 44 and the second porous member 45.

In addition, the liquid LQ on the substrate P can also flow via the holes 46 of the first porous member 44 into the space 56 between the first porous member 44 and the second porous member 45.

In the present embodiment, the second surface 52 and the liquid contact surface 61 are disposed within substantially the same plane (i.e., the XY plane). For example, during the exposure of the substrate P, a gap G3, which is disposed between the second surface 52 and the front surface of the substrate P, and a gap G4, which is disposed between the liquid contact surface 61 and the front surface of the substrate P, are substantially the same size. In the present embodiment, the size of the gap G3 in the Z axial directions is 10-500 microns. In the present embodiment, the size of the gap G3 in the Z axial directions is smaller than that of the gap G1 in the Z axial directions. For example, the size of the gap G1 is 2-200 times that of the gap G3.

Furthermore, the second surface 52 and the liquid contact surface 61 do not have to be disposed within the same plane. For example, the second surface 52 may be disposed above the liquid contact surface 61 (i.e., at a position spaced apart from the front surface of the substrate P) or below the liquid contact surface 61 (i.e., at a position proximate to the front surface of the substrate P). In addition, the second surface 52 and the liquid contact surface 61 do not have to be parallel. For example, at least part of the second surface 52 may be inclined upward toward the outer side in radial directions with respect to the optical path K of the exposure light EL (i.e., the optical axis AX of the last optical element 22).

In the present embodiment, the second surface 52 is liquid repellent with respect to the liquid LQ. The contact angle of the liquid LQ with respect to the second surface 52 is, for example, 90° or greater. The receding contact angle of the liquid LQ with respect to the second surface 52 is 90° or greater.

In the present embodiment, the second surface 52 is more liquid repellent with respect to the liquid LQ than is the first surface 51, the third surface 53, or the fourth surface 54, or any combination thereof.

In the present embodiment, the second surface 52 is formed by a film that is liquid repellent with respect to the liquid LQ. In the present embodiment, the material used to form the film is fluorine based (fluorinated member, fluorochemical film). In the present embodiment, the film is a tetrafluoroethylene-perfluoro (alkyl vinyl ether) copolymer (PFA) film. Furthermore, the film may also be a, for example, polytetrafluoroethylene (PTFE), polyetheretherketone (PEEK), or Teflon® film. In addition, the film may also be Cytop™ (made by Asahi Glass Co.) or Novec EGC™ (made by 3M Company) film.

In the present embodiment, the first surface 51 is liquid repellent with respect to the liquid LQ. The contact angle of the liquid LQ with respect to the first surface 51 is, for example, 90° or greater. As in the second surface 52, the first surface 51 is formed by a liquid repellent film. The receding contact angle of the liquid LQ with respect to the first surface 51 is 90° or greater.

In addition, in the present embodiment, inner surfaces of the holes 46 are also liquid repellent with respect to the liquid LQ.

Furthermore, the first porous member 44 is formed from a material that is liquid repellent with respect to the liquid LQ; furthermore, the first surface 51, the second surface 52, the third surface 53, or the fourth surface 54, or any combination thereof, is formed by a film such that the second surface 52 is more liquid repellent with respect to the liquid LQ than is the first surface 51, the third surface 53, or the fourth surface 54, or any combination thereof.

In the present embodiment, the fourth surface 54 is lyophilic with respect to the liquid LQ. The contact angle of the liquid LQ with respect to the fourth surface 54 is, for example, smaller than 90°. In the present embodiment, the fourth surface 54 is made of titanium.

In the present embodiment, the third surface 53 is lyophilic with respect to the liquid LQ. The third surface 53 is made of titanium. In addition, the inner surfaces of the holes 47 are likewise made of titanium and are lyophilic with respect to the liquid LQ.

In the present embodiment, among the first surface 51, the second surface 52, the third surface 53, and the fourth surface 54, the second surface 52 is the most liquid repellent with respect to the liquid LQ. Furthermore, the first surface 51 and the second surface 52 have substantially equal liquid repellency with respect to the liquid LQ.

Figure 4:
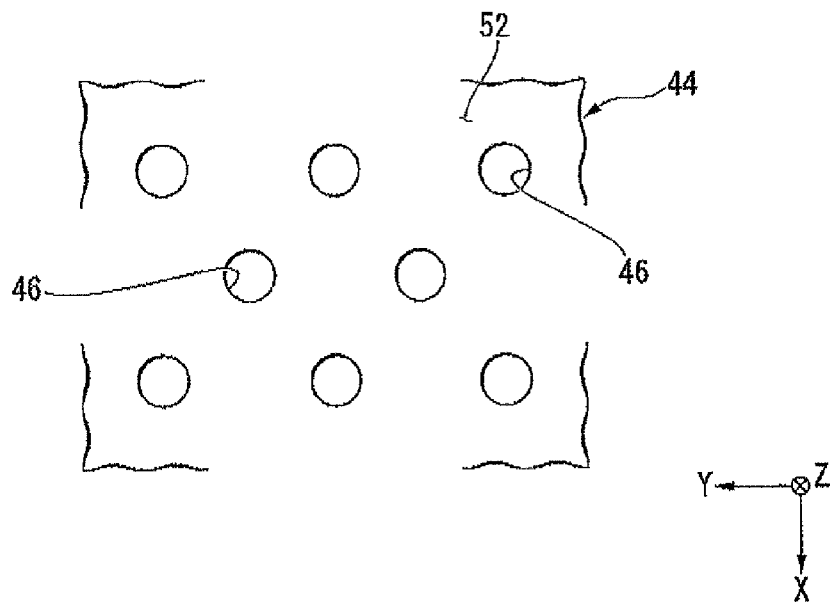
FIG. 4 shows one example of a first porous member according to the first embodiment.
Figure 5:
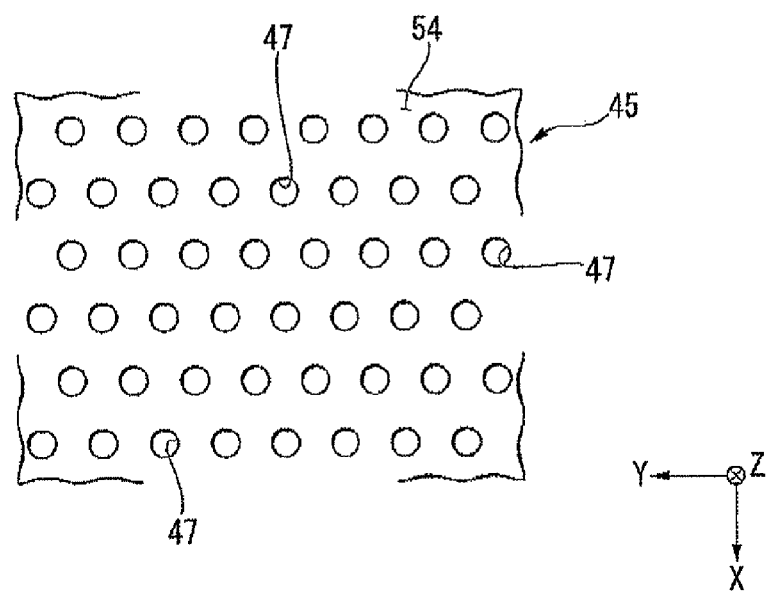
FIG. 5 shows one example of a second porous member according to the first embodiment.

FIG. 4 is a schematic drawing that shows part of the second surface 52 of the first porous member 44, and FIG. 5 is a schematic drawing that shows part of the fourth surface 54 of the second porous member 45. In the present embodiment, each of the holes 46 within a plane parallel to the second surface 52 has a circular shape. In addition, each of the holes 47 within a plane parallel to the fourth surface 54 has a circular shape. In the present embodiment, the diameter (i.e., the size) of each of the holes 46 is greater than that of each of the holes 47. For example, the diameter of each of the holes 46 is 500-5000 microns, and the diameter of each of the holes 46 is 5-200 times the diameter of each of the holes 47. Thereby, the liquid LQ on the substrate P can flow smoothly into the space 56 via the holes 46. Furthermore, the diameters of the holes 46 in the first porous member 44 do not all have to be the same. Similarly, the diameters of the holes 47 of the second porous member 45 do not all have to be the same. Accordingly, in the present embodiment, the fact that the diameters of the holes 46 of the first porous member 44 are greater than the diameters of the holes 47 of the second porous member 45 includes, for example, cases wherein the average of the diameters of the holes 46 of the first porous member 44 is greater than that of the holes 47 of the second porous member 45, and the case wherein the diameter of the smallest hole among the holes 46 of the first porous member 44 is larger than the diameter of the smallest hole of the holes 47 of the second porous member 45.

As shown in FIG. 2 and FIG. 3, the liquid recovery part 32 is disposed above the first porous member 44. The liquid recovery part 32 is capable of recovering both the liquid LQ that flows from the space between the second surface 52 and the substrate P into the first gap G1 (i.e., the space 56) via the holes 46 of the first porous member 44 and the liquid LQ on the substrate P without transiting the holes 46 of the first porous member 44. Namely, the liquid recovery part 32 is capable of recovering both the liquid LQ that flows from the space between the second surface 52 and the front surface of the substrate P into the first gap G1 (i.e., the space 56) via the holes 46 of the first porous member 44 and the liquid LQ on the substrate P via the second gap G2 (i.e., the opening 55)

between the liquid contact surface 61 and the second surface 52 without transiting the holes 46 of the first porous member 44. The liquid LQ on the substrate P can flow into the first gap G1 via either the holes 46 of the first porous member 44 or the opening 55, or both. The liquid recovery part 32 can recover the liquid LQ on the substrate P that flows into the first gap G1.

In the present embodiment, the liquid recovery part 32 recover via the holes 47 of the second porous member 45 at least some of the liquid LQ that contacts the second porous member 45.

In the present embodiment, the control apparatus 7 adjusts the pressure in the recovery passageway 35 by controlling the liquid recovery apparatus 41 such that only the liquid LQ is suctioned into the recovery passageway 35 via the second porous member 45, namely, such that gas does not flow into the recovery passageway 35 via the second porous member 45. The control apparatus 7 adjusts the pressure differential between the third surface 53 side and the fourth surface 54 side by adjusting the pressure in the recovery passageway 35 such that only the liquid LQ is suctioned into the recovery passageway 35.

In the present embodiment, the space 56 is open on the fourth surface 54 side to the atmosphere via the holes 46 of the first porous member 44, and the chamber apparatus 5 controls the pressure in the space 56. In the present embodiment, the pressure in the space 56 between the liquid recovery part 32 and the first porous member 44 is higher than the pressure in the recovery passageway 35. Furthermore, the pressure in the space 56 is substantially equal to the pressure in the space on the second surface 52 side (i.e., the space between the first porous member 44 and the substrate P).

The control apparatus 7 adjusts the pressure on the third surface 53 side (i.e., the pressure in the recovery passageway 35) by controlling the liquid recovery apparatus 41 such that only the liquid LQ passes through the second porous member 45 from the fourth surface 54 side to the third surface 53 side. Namely, the control apparatus 7 adjusts the difference between the pressure on the third surface 53 side and the pressure on the fourth surface 54 side such that only the liquid LQ is recovered via the holes 47 of the second porous member 45 and such that gas does not pass through the holes 47 of the second porous member 45. The technology for adjusting the pressure differential between the one side and the other side of the porous member, thereby causing only the liquid LQ to pass through the porous member from the one side to the other side thereof, is disclosed in, for example, U.S. Pat. No. 7,292,313.

Furthermore, in the present embodiment, the "atmosphere" is the air that surrounds the liquid immersion member 4. In the present embodiment, the air that surrounds the liquid immersion member 4 is the air in the internal space 8 formed by the chamber apparatus 5. In the present embodiment, the chamber apparatus 5 uses the environmental control apparatus 5B to fill the internal space 8 with clean air. In addition, the chamber apparatus 5 uses the environmental control apparatus 5B to adjust the pressure in the internal space 8 to substantially atmospheric pressure. Of course, the pressure in the internal space 8 may be set higher than atmospheric pressure.

Furthermore, in the present embodiment, the pressure in the space 56 may be higher than the pressure in the recovery passageway 35 and lower than the pressure in the space on the second surface 52 side.

The supply ports 31 are disposed at prescribed regions of the liquid immersion member 4 such that they face the optical path K of the exposure light EL emerging from the emergent surface 23. In the present embodiment, the main body part 48 of the liquid immersion member 4 has an inner surface 62, which is disposed above the emergent surface 23 and opposes at least part of the projection optical system PL across a gap G5. The inner surface 62 includes: an inner side surface 62A, which opposes at least part of a side surface 22A of the last optical element 22; and an upper surface 62B, which is disposed around the side surface 22A and opposes a lower surface 2213 that faces downward (i.e., in the –Z direction). The side surface 22A and the lower surface 2213 differ from the emergent surface 23 and are surfaces wherethrough the exposure light EL does not pass. Furthermore, the lower surface 2213 may be part of the last optical element 22 or of the holding member 21. In the present embodiment, the supply ports 31 are disposed in the inner side surface 62A.

In the present embodiment, the supply ports 31 are disposed on the +Y and –Y sides, one on each side, of the opening 50 (i.e., of the optical path K of the exposure light EL). Furthermore, the supply ports 31 may be disposed on the +X and –X sides, one on each side, of the opening 50 (i.e., of the optical path K of the exposure light EL). In addition, the number of the supply ports 31 is not limited to two. The supply ports 31 may be disposed at three or more locations around the optical path K of the exposure light EL.

In the present embodiment, the emergent surface 23 and at least part of the upper surface 60 of the plate part 49 oppose one another across a gap G6. The supply ports 31 supply the liquid LQ to the space between the emergent surface 23 and the upper surface 60. The liquid LQ supplied via the supply ports 31 is supplied to the optical path K of the exposure light EL emerging from the emergent surface 23. Thereby, the optical path K of the exposure light EL is filled with the liquid LQ.

Furthermore, the supply ports 31 may be disposed in the inner side surface 62A such that they oppose the side surface 22A. In addition, the supply ports 31 may supply the liquid LQ to the space between the side surface 22A and the inner side surface 62A. In addition, the supply ports 31 may be provided in the lower surface 30.

In the present embodiment, the gap G5 between the projection optical system PL and the inner surface 62 of the liquid immersion member 4 is open to the atmosphere. The gap G5 is open to the atmosphere via an opening 63, which faces the internal space 8. At least some of the liquid LQ supplied via the supply ports 31 flows into the gap G5.

The recovery ports 33 are disposed at positions more spaced apart from the optical path K than the supply ports 31 are. The recovery ports 33 are disposed in the inner side surface 62A. The recovery ports 33 recover at least some of the liquid LQ that is between the side surface 22A and the inner side surface 62A. Thereby, the liquid LQ in the immersion space LS is prevented from flowing via the upper surface 62B to the outer side of the liquid immersion member 4.

In the present embodiment, during at least part of the exposure of the substrate P, a supply operation that supplies the liquid LQ via the supply ports 31, a recovery operation that recovers the liquid LQ via the liquid recovery part 32, and a recovery operation that recovers the liquid LQ via the recovery ports 33 are performed in parallel, and thereby the immersion space LS of a prescribed size is formed such that the optical path K of the exposure light EL is filled with the liquid LQ.

At least some of the liquid LQ supplied via the supply ports 31 to the space between the emergent surface 23 and the upper surface 60 is supplied via the opening 50 to the space between the liquid contact surface 61 and the front surface of the substrate P. The optical path K of the exposure light EL between the emergent surface 23 and the front surface of the substrate P is filled with the liquid LQ supplied via the supply ports 31. In addition, at least some of the liquid LQ is held between the lower surface 30, which includes the liquid contact surface 61 and the second surface 52, and the front surface of the substrate P, thereby forming part of the immersion space LS.

The liquid recovery part 32 recovers at least some of the liquid LQ that is between the lower surface 30 and the front surface of the substrate P. The liquid recovery part 32 recovers the liquid LQ that flows into the space 56 (i.e., the first gap G1) via the holes 46 of the first porous member 44 or the liquid LQ that flows into the space 56 via the opening 55, or both.

In the present embodiment, when the substrate P is irradiated with the exposure light EL, the immersion space LS is already formed such that part of the area of the front surface of the substrate P that includes the projection area PR is covered with the liquid LQ. The exposure apparatus EX of the present embodiment adopts a local liquid immersion system.

In the present embodiment, an air-liquid interface (i.e., a meniscus) of the liquid LQ in the immersion space LS includes: a first interface LG1 disposed between the lower surface 30 and the front surface of the substrate P, which opposes the lower surface 30; and a second interface LG2 disposed between the side surface 22A and the inner side surface 62A. In the example shown in FIG. 2 and FIG. 3, the interface LG1 is disposed between the second surface 52 of the first porous member 44 and the front surface of the substrate P.

The following text explains a method of using the exposure apparatus EX that has the abovementioned configuration to expose the substrate P.

The control apparatus 7 causes the emergent surface 23 of the projection optical system PL and the lower surface 30 of the liquid immersion member 4 on one side and the front surface of the substrate P (or the upper surface 26 of the substrate stage 2) on the other side to oppose one another. The control apparatus 7 performs in parallel the supply operation that supplies the liquid LQ via the supply ports 31, the recovery operation that recovers the liquid LQ via the liquid recovery part 32, and the recovery operation that recovers the liquid LQ via the recovery ports 33; forms the immersion space LS such that the liquid LQ fills the optical path K of the exposure light EL between the emergent surface 23 of the last optical element 22 and the substrate P, which opposes the emergent surface 23; and starts the exposure of the substrate P.

The control apparatus 7 illuminates the mask M with the exposure light EL by causing the illumination system IL to emit the exposure light EL. The exposure light EL that emerges from the mask M emerges from the emergent surface 23 of the projection optical system PL. The control apparatus 7 radiates the exposure light EL that emerges from the emergent surface 23 to the substrate P through the liquid LQ that is between the projection optical system PL and the emergent surface 23 on one side and the front surface of the substrate P on the other side. Thereby, the image of the pattern of the mask M is projected to the substrate P, which is thereby exposed with the exposure light EL.

As discussed above, the exposure apparatus EX of the present embodiment is a scanning type exposure apparatus wherein the substrate P is moved in prescribed directions within the XY plane in the state wherein the liquid LQ is held between the emergent surface 23 and the substrate P (i.e., in the state wherein the immersion space LS is formed) during at least part of the exposure of the substrate P. For example, during the radiation of the exposure light EL to the substrate P (i.e., during the scanning exposure), the substrate P moves in the Y axial directions with respect to the last optical element 22 and the liquid immersion member 4. In addition, if multiple shot regions on the substrate P are sequentially exposed, then, when a second shot region is to be exposed after the exposure of a first shot region, the substrate P is moved (i.e., stepped) in, for example, either one of the X axial directions with respect to the last optical element 22 and the liquid immersion member 4 or a direction that is tilted with respect to the X axis within the XY plane. In addition, the movement during a scanning exposure is not limited to stepping; for example, it is also possible for the substrate P to move under various movement conditions in the state wherein the liquid LQ is held between the substrate P and the emergent surface 23.

The movement conditions of the substrate P include either a movement velocity and an acceleration (or a deceleration) in a prescribed direction (e.g., the Y direction) within the XY plane or a movement distance (e.g., the distance moved from a first position to a second position within the XY plane), or both.

In the present embodiment, because the first porous member 44 is disposed at a position proximate to the substrate P, it is possible to prevent both the liquid LQ from leaking out of the space between the liquid immersion member 4 and the substrate P and a film, a drop, or the like of the liquid LQ from remaining on the substrate P even if, for example, the substrate P is moved at high speed, the substrate P is moved with great acceleration, or the movement distance of the substrate P is increased.

Namely, because the gap G3 between the second surface 52 of the first porous member 44 and the front surface of the substrate P is small, it is possible to reduce the size of the interface LG1 of the liquid LQ in the immersion space LS between the lower surface 30 (i.e., the second surface 52) and the front surface of the substrate P (i.e., the size in directions, that is, the Z directions, parallel to the normal line of the front surface of the substrate P). Thereby, it is possible to prevent both the liquid LQ from leaking out of the space between the liquid immersion member 4 and the substrate P and a film, a drop, or the like of the liquid LQ from remaining on the substrate P even if the substrate P is moved at high speed, the substrate P is moved with great acceleration, or the movement distance of the substrate P is increased.

For example, in the case wherein the gap between the front surface of the substrate P and the lower surface of the liquid immersion member is large and the size of the interface LG1 of the liquid LQ formed on the substrate P is large, there is a strong possibility that the interface LG1 of the liquid LQ will move together with the substrate P and a film will form on the substrate P if the substrate P is moved at high speed in pre-scribed directions within the XY plane. As a result, the liquid LQ might leak out of the space between the liquid immersion member and the front surface of the substrate P and a film, a drop, or the like of the liquid LQ might remain on the substrate P.

In the present embodiment, the liquid recovery part 32 is disposed far from the object (i.e., the substrate P); however, because the gap G3 between the second surface 52 of the first porous member 44 and the front surface of the substrate P is small, namely, the size of the interface LG1 between the second surface 52 and the front surface of the substrate P is small, it is possible to prevent the liquid LQ from leaking out and the like.

In addition, at least some of the liquid LQ on the substrate P can flow into the space 56 via the opening 55 and therefore can be recovered smoothly by the liquid recovery part 32.

In addition, at least some of the liquid LQ between the second surface 52 of the first porous member 44 and the front surface of the substrate P can flow into the space 56 via the holes 46 of the first porous member 44. Accordingly, in the radial directions with respect to the optical axis AX, the interface LG1 between the second surface 52 of the first porous member 44 and the front surface of the substrate P is prevented from becoming greatly spaced apart from the optical axis AX, the immersion space LS is prevented from enlarging within the XY plane, and the like. In other words, even if the substrate P is moved in a prescribed direction within the XY plane, at least some of the liquid LQ that is between the second surface 52 of the first porous member 44 and the front surface of the substrate P flows into the space 56 via the holes 46 of the first porous member 44, which prevents the interface LG1 (i.e., the liquid LQ) that is between the first porous member 44 and the substrate P from moving in that prescribed direction (i.e., from enlarging). In addition, even if the interface LG1 is moved in that prescribed direction, at least some of the liquid LQ can flow into the space 56 via the holes 46 of the first porous member 44, which makes it possible to quickly change the direction of the movement of the interface LG1, which moved in that prescribed direction, to the reverse direction thereof. Consequently, it is possible to more effectively prevent, for example, the liquid LQ from leaking out.

In addition, as discussed above, in the present embodiment, the liquid recovery part 32 is disposed at a position at which it is more spaced apart from the object (i.e., the substrate P) than the first porous member 44 is, which prevents the liquid recovery part 32 from becoming contaminated.

For example, if the second porous member 45 of the liquid recovery part 32 were disposed at a position at which it were proximate to the front surface of the substrate P, the fourth surface 54 would very likely become contaminated. In addition, if the fourth surface 54 were lyophilic with respect to the liquid LQ, for example, there would be an increased possibility that substances (e.g., organic substances such as the photosensitive material) discharged from the substrate P during the exposure of the substrate P and mixed with the liquid LQ in the immersion space LS as contaminants (i.e., foreign matter or particles) would adhere to the fourth surface 54, which makes contact with that liquid LQ. As a result, it would increase the likelihood of the second porous member 45 becoming contaminated.

In the present embodiment, because the second porous member 45 is disposed at a position at which it is more spaced apart from the substrate P than the first porous member 44 is, the second porous member 45 is prevented from becoming contaminated. In addition, because the second porous member 45 is prevented from becoming contaminated, the ability of the liquid recovery part 32 to recover liquid is maintained.

In addition, because the second porous member 45 is prevented from becoming contaminated, it is possible to suction only the liquid LQ into the recovery passageway 35 via the second porous member 45.

In addition, because the second porous member 45 is disposed spaced apart from the object (i.e., the substrate P), it is possible to prevent, for example, the object (i.e., the substrate P) from becoming contaminated owing to the contamination of the second porous member 45.

Moreover, the front surface of the first porous member 44 (i.e., the first surface 51, the second surface 52, or the inner surfaces of the holes 46, or any combination thereof) is liquid repellent with respect to the liquid LQ. Accordingly, even if the first porous member 44 is disposed at a position proximate to the substrate P, contaminants would still be prevented from adhering to the front surface of the first porous member 44. Namely, because the front surface of the first porous member 44 is liquid repellent, even if that front surface contacts the liquid LQ, any contaminants present in that liquid LQ will be prevented from adhering to the front surface of the first porous member 44.

In addition, even if contaminants do adhere to the front surface of the first porous member 44, there is a strong possibility that those contaminants will not remain on the front surface of the first porous member 44 and will separate therefrom and be recovered via the liquid recovery part 32. Accordingly, contaminants are prevented from continuing to adhere to the front surface of the first porous member 44, contaminants are prevented from amassing (i.e., growing) on the front surface of the first porous member 44, and the like. Accordingly, contaminants (i.e., foreign matter) owing to the contamination of the first porous member 44 are prevented from adhering to the front surface of the substrate P, adhering to the upper surface 26 of the substrate stage 2, and contaminating the liquid LQ supplied via the supply ports 31 and thereby moving along the optical path K of the exposure light EL.

In addition, because the first porous member 44 is disposed at a position at which it can be easily maintained (i.e., cleaned or replaced), the first porous member 44 can be maintained smoothly if the first porous member 44 becomes contaminated.

As explained above, it is possible to prevent, for example, the liquid LQ from leaking out, as well as from remaining on the front surface of the object (i.e., the substrate P and the like), which opposes the lower surface 30. Accordingly, it is possible to prevent exposure failures from occurring while preventing a decline in throughput.

Furthermore, in the present embodiment, the surface (i.e., the first surface 51, the second surface 52, or the inner surfaces of the holes 46, or any combination thereof) of the first porous member 44 may be lyophilic with respect to the liquid LQ. For example, depending on the characteristics (i.e., the material properties) of the substances that might be discharged from the substrate P, if making the surface of the first porous member 44 lyophilic with respect to the liquid LQ would prevent the surface of the first porous member 44 from becoming contaminated, then the first porous member 44 may be made lyophilic with respect to the liquid LQ.

<Second Embodiment>

The following text explains a second embodiment. In the explanation below, constituent parts that are identical or equivalent to those in the embodiment discussed above are assigned identical symbols, and the explanations thereof are therefore abbreviated or omitted.

Figure 6:
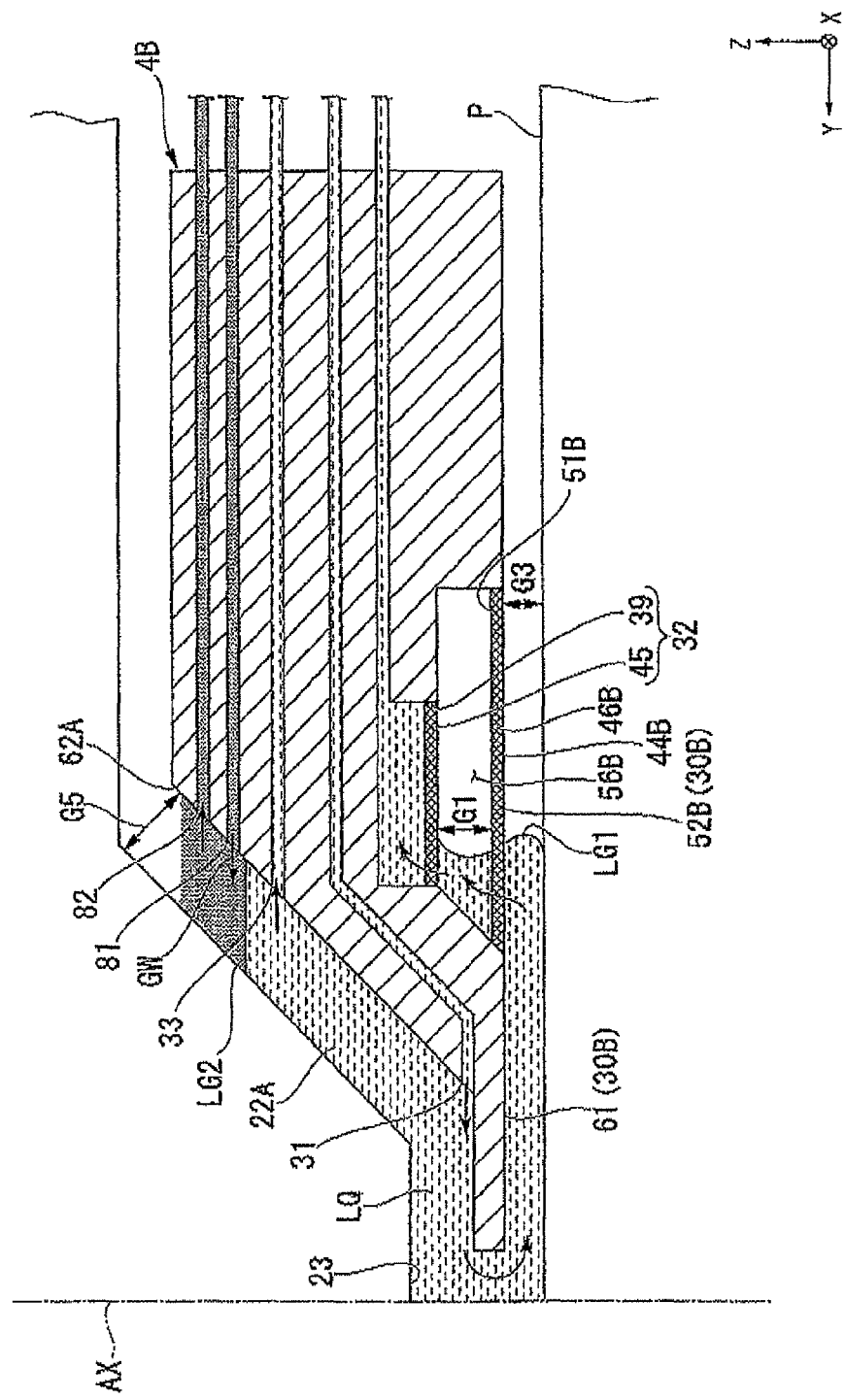
FIG. 6 shows the vicinity of the liquid immersion member according to a second embodiment.

FIG. 6 is a view that shows one example of a liquid immersion member 4B according to the second embodiment. The characteristic feature of the second embodiment, which differs from the first embodiment, is that a second surface 52B of a first porous member 44B is not disposed spaced apart from the liquid contact surface 61 in a lower surface 30I3 of the liquid immersion member 4B. Namely, the opening (55) is not provided to the lower surface 30I3 of the liquid immersion member 4B according to the second embodiment.

In the present embodiment, too, the gap G3 between the second surface 52B of the first porous member 44B and the front surface of the substrate P is small, which makes it possible to prevent the liquid LQ from leaking out, and the like. In the present embodiment, the liquid LQ on the substrate P can flow into a space 56B between the first porous member 44B and the second porous member 45 via holes 46B of the first porous member 44B. Accordingly, the liquid recovery part 32 can recover the liquid LQ that flows into the space 56 via the holes 46B of the first porous member 44B. For example, the number, the size, and the position of the holes 46B of the first porous member 44B, the thickness of the first porous member 44B (i.e., the distance between a first surface 51B and the second surface 52B), and the like can be set as appropriate, which makes it possible for the liquid LQ that is between the first porous member 44B and the substrate P to flow smoothly into the space 56B via the holes 46B of the first porous member 44B.

In addition, in the present embodiment, the opening 55 is not provided to the liquid immersion member 4B, and the liquid LQ on the object (i.e., the substrate P) flows into the space 56B via the first porous member 44B, which makes it possible to prevent the liquid recovery part 32 (i.e., the second porous member 45) from becoming contaminated.

In addition, in the present embodiment, the liquid immersion member 4B has gas supply ports 81, which supply a gas GW to the gap G5. The gas supply ports 81 are disposed such that they face the gap G5. In the present embodiment, the gas supply ports 81 are disposed in the inner side surface 62A of the liquid immersion member 4B, which opposes the side surface 22A of the last optical element 22. The inner side surface 62A is disposed around the side surface 22A and opposes the side surface 22A across the gap G5.

In the present embodiment, the gas supply ports 81 supply the gas GW, which is adjusted by the chamber apparatus 5 and whose humidity is higher than that of the internal space 8, to the gap G5. The gas supply ports 81 supply the gas GW such that the gas GW contacts the interface LG2 of the liquid LQ that flows into the gap G5.

The gas supply ports 81 are connected to a gas supply apparatus (not shown) via internal passageways of the liquid immersion member 4B. The gas supply apparatus supplies the gas, whose humidity is higher than that of the gas supplied from the chamber apparatus 5 to the internal space 8, to the gas supply ports 81. In the present embodiment, the gas supply apparatus supplies the gas, which is the same type of gas as the gas of the internal space 8, to the gas supply ports 81. In addition, the gas supply apparatus humidifies the gas supplied to the supply ports 81 using the vapor of a liquid that is the same type of liquid as the liquid LQ. In the present embodiment, the chamber apparatus 5 fills the internal space 8 with clean air, and the gas supply ports 81 supply air, which has been humidified with water vapor, to the gap G5.

In addition, in the present embodiment, the liquid immersion member 4B has recovery ports 82, which are disposed such that they face the gap G5, that recover at least some of the gas GW supplied via the gas supply ports 81. In the present embodiment, the recovery ports 82 are disposed in the inner side surface 62A of the liquid immersion member 4B. In addition, the recovery ports 82 can recover the liquid LQ in the gap G5.

In the present embodiment, the recovery ports 82 are disposed above the gas supply ports 81. The recovery ports 82 are disposed above and adjacent to the gas supply ports 81.

Because the gas GW is supplied via the gas supply ports 81 such that the gas GW contacts the interface LG2 of the liquid LQ, the liquid LQ is prevented from vaporizing. Accordingly, it is possible to prevent a change in temperature of the liquid LQ, the liquid immersion member 4B, or the object (i.e., the substrate P) that opposes the liquid immersion member 4B, or any combination thereof, owing to the heat of vaporization of the liquid LQ.

In addition, at least some of the gas GW supplied via the gas supply ports 81 is recovered via the recovery ports 82. Thereby, the gas GW supplied via the gas supply ports 81 is prevented from flowing to the outer part from the space between the liquid immersion member 4B and the projection optical system PL (i.e., to the atmosphere).

<Third Embodiment>

The following text explains a third embodiment. In the explanation below, constituent parts that are identical or equivalent to those in the embodiment discussed above are assigned identical symbols, and the explanations thereof are therefore abbreviated or omitted.

Figure 7:
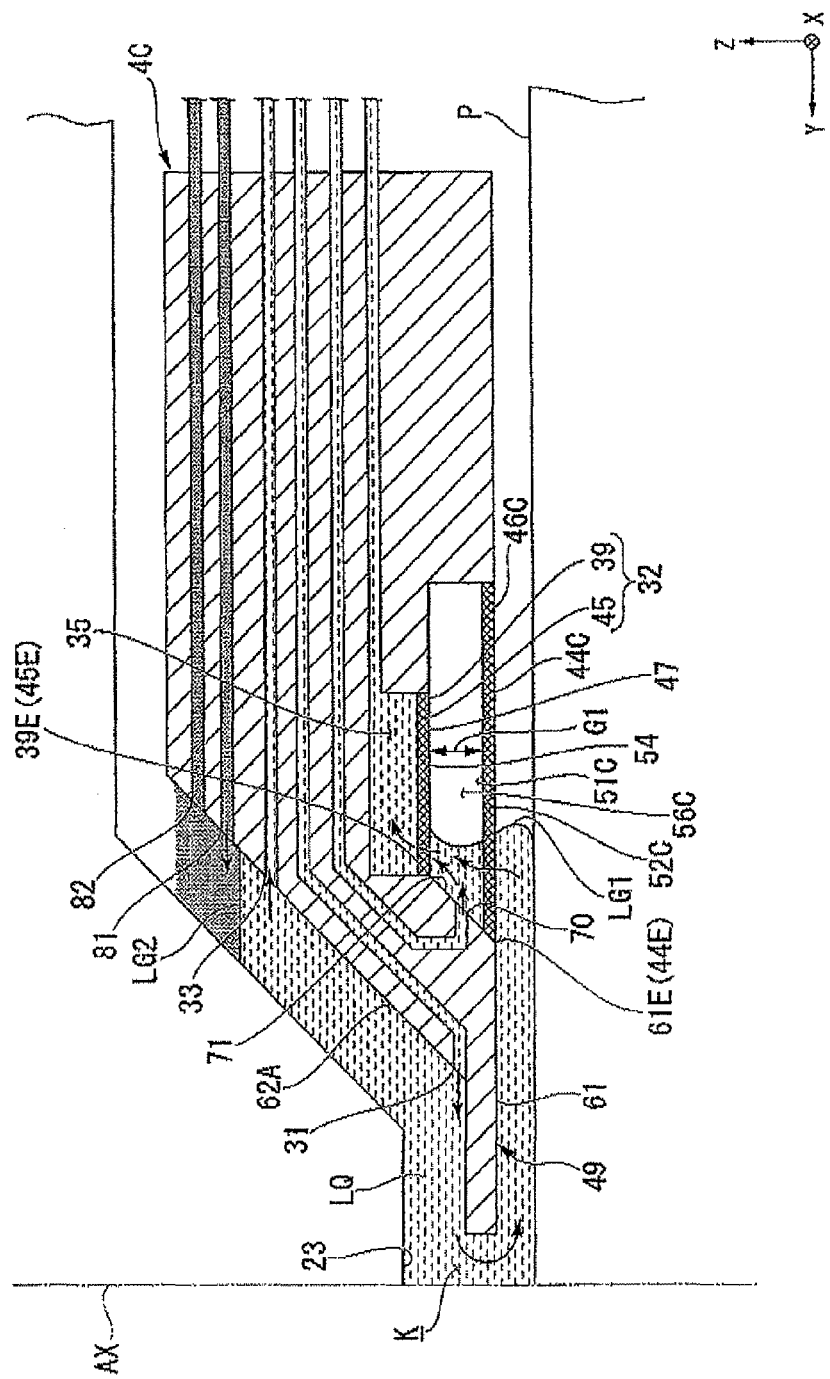
FIG. 7 shows the vicinity of the liquid immersion member according to a third embodiment.

FIG. 7 is a view that shows one example of a liquid immersion member 4C according to the third embodiment. The characteristic feature of the third embodiment, which differs from the first and second embodiments, is that supply ports 70, which supply the liquid LQ to the space between a first porous member 44C and the second porous member 45, are provided.

As shown in FIG. 7, the liquid immersion member 4C has the supply ports 31, which supply the liquid LQ to the optical path K of the exposure light EL, and the supply ports 70, which are separate from the supply ports 31. The supply ports 70 supply the liquid LQ to the space between the first porous member 44C and the second porous member 45. In the present embodiment, the liquid LQ supplied via the supply ports 70 is the same type of liquid as the liquid LQ supplied via the supply ports 31.

Furthermore, the liquid LQ supplied via the supply ports 70 and the liquid LQ supplied via the supply ports 31 may be different types of liquids. In addition, the liquid LQ supplied via the supply ports 70 and the liquid LQ supplied via the supply ports 31 may be the same type of liquid but of different temperatures or different cleanliness levels.

As in the embodiments discussed above, the first porous member 44C and the second porous member 45 are disposed such that a first surface 51C and the fourth surface 54 oppose one another across the first gap G1. The supply ports 70 supply the liquid LQ to a space 56C (i.e., the first gap G1) between the first porous member 44C and the second porous member 45.

In the present embodiment, the supply ports 70 are disposed in the vicinity of the outer side edge 61E of the liquid contact surface 61 (i.e., an inner side edge 44E of the first porous member 44C), which is near the second surface 52C. In the present embodiment, the liquid immersion member 4C has an inner surface 71, which faces the space 56C between the first porous member 44C and a second porous member 45. The inner surface 71 includes a surface that connects an inner side edge 39E (i.e., an inner side edge 45E of the second porous member 45), which is near the optical axis AX side of the recovery port 39, and the outer side edge 61E (44E) of the liquid contact surface 61. The supply ports 70 are disposed in the inner surface 71. Namely, in the present embodiment, the supply ports 70 are each oriented in a radial direction with respect to the optical axis AX (i.e., in a direction away from the optical axis AX). In the present embodiment, the inner surface 71 is inclined upward toward the outer side in radial directions with respect to the optical axis AX. Furthermore, the inner surface 71 may be parallel to the optical axis AX. In addition, in the present embodiment, in directions parallel to the optical axis AX, the supply ports 70 are disposed nearer to the first porous member 44C than the second porous member 45 is.

In addition, in the present embodiment, too, the second surface 52C is not spaced apart from the liquid contact surface 61. The liquid LQ on the substrate P can flow into the space 56C via holes 46C of the first porous member 44C. As in the embodiments discussed above, the liquid recovery part 32, which includes the second porous member 45, recovers the liquid LQ in the space 56C via the holes 47 of the second porous member 45. Thus, in the present embodiment, the liquid LQ between the second surface 52C and the front surface of the substrate P is recovered through the recovery passageway 35 via the first porous member 44C and the second porous member 45.

In the present embodiment, the liquid LQ supplied via the supply ports 70 flows in a direction that leads away from the optical path K of the exposure light EL. Namely, in the present embodiment, the supply ports 70 supply the liquid LQ toward the outer side in radial directions with respect to the optical axis AX.

In the present embodiment, the supply ports 70 supply the liquid LQ in directions substantially parallel to the XY plane. Furthermore, the supply ports 70 may supply the liquid LQ upward and toward the outer side in radial directions with respect to the optical axis AX.

In the present embodiment, the supply ports 70 are disposed at positions at which they can contact the liquid LQ that flows from on the substrate P into the first gap G1 (i.e., the space 56C) via the holes 46C of the first porous member 44C. As shown in FIG. 7, the supply ports 70 are disposed at positions at which they are immersed in the liquid LQ that flows into the first gap G1 via the holes 46C of the first porous member 44C.

By supplying the liquid LQ to the first gap G1, the supply ports 70 promote the flow of the liquid LQ from the first surface 51C of the first porous member 44C to the fourth surface 54 of the second porous member 45.

The supply ports 70 supply the liquid LQ to the first gap G1 in the state wherein the supply ports 70 are immersed in the liquid LQ that flows from on the substrate P into the first gap G1 via the holes 46C of the first porous member 44C (i.e., in the state wherein the supply ports 70 contact the liquid LQ). Thereby, the liquid LQ that flows from on the substrate P into the first gap G1 flows smoothly toward the second porous member 45 of the liquid recovery part 32.

As explained above, the present embodiment provides the supply ports 70, which supply the liquid LQ to the space between the first porous member 44C and the second porous member 45, which makes it possible to smoothly recover the liquid LQ on the substrate P via the first porous member 44C and the second porous member 45. Namely, supplying the liquid LQ via the supply ports 70 makes it possible to satisfactorily feed the liquid LQ that flows into the first gap G1 via the first porous member 44C to the liquid recovery part 32. Accordingly, it is possible to satisfactorily recover the liquid LQ while preventing the interface LG1 (i.e., the liquid LQ) in the space between the first porous member 44C and the substrate P from moving (i.e., enlarging).

Furthermore, in the third embodiment, the second surface 52C may be disposed spaced apart from the liquid contact surface 61. Namely, the opening 55 may be provided between the liquid contact surface 61 and the second surface 52C.

Furthermore, in the second and third embodiments discussed above, the recovery ports 82 do not have to be provided if it is permissible for the gas GW to flow out to the internal space 8 (i.e., the atmosphere).

In addition, as in the first embodiment, in the second and third embodiments discussed above, too, the gas supply ports 81 and the recovery ports 82 do not have to be provided.

Furthermore, either the gas supply ports 81 or the gas supply ports 81 together with the recovery ports 82 may be provided to the liquid immersion member 4 of the first embodiment discussed above.

Furthermore, in the first through third embodiments discussed above, the holes 46 (46B, 46C) and the holes 47 have a substantially circular shape, but they may have, for example, a polygonal shape, such as a hexagonal shape or an octagonal shape. In addition, the shape of the holes 46 (46B, 46C) and the shape of the holes 47 may be different. In addition, holes of different shapes may be present in a single porous member.

Furthermore, in the first through third embodiments discussed above, the recovery ports 33 may be omitted.

In addition, in the first through third embodiments discussed above, a flat part that opposes the first porous member (51, 51B, 51C) is provided to the outer side of the liquid recovery part 32 (i.e., the second porous member 45) with respect to the optical axis AX. Namely, in the present embodiment, the upper surface of the space 56 includes the lower surface 54 of the second porous member 45 and the flat part therearound; however, the flat part may not be provided around the lower surface 54 of the second porous member 45, and the upper surface of the space 56 may be formed by the lower surface 54 of the second porous member 45 only.

In addition, in the first through third embodiments discussed above, the liquid recovery part 39 adjusts the pressure in the recovery passageway 35 such that only the liquid LQ flows from the space (56, 56B, 56C) into the recovery passageway 35 via the second porous member 45; however, the pressure in the recovery passageway 35 may be adjusted such that the liquid LQ and the gas together flow into the recovery passageway 35 via the second porous member 45.

<Fourth Embodiment>

Figure 8:
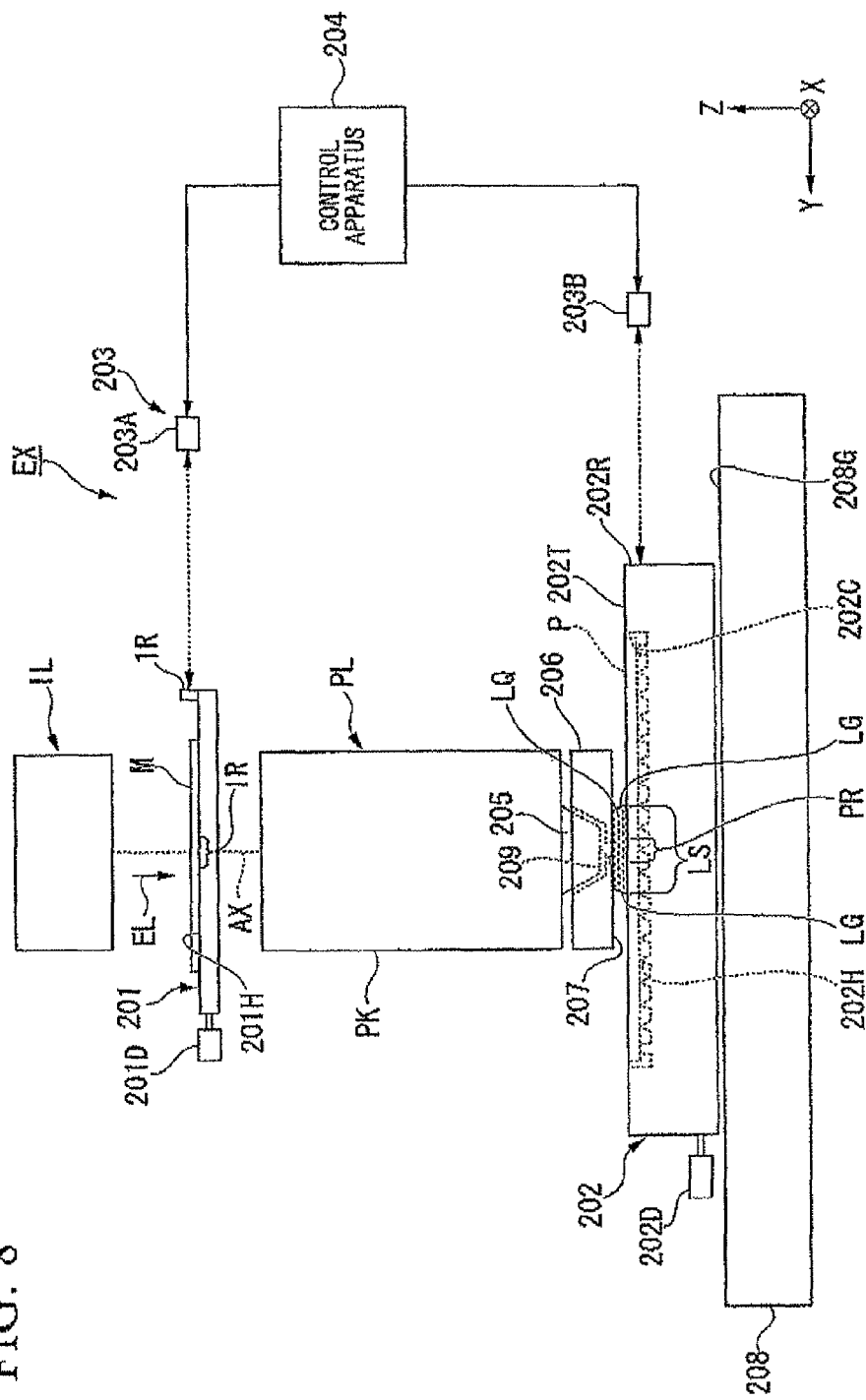
FIG. 8 is a schematic block diagram that shows one example of an exposure apparatus according to a fourth embodiment.

A fourth embodiment will now be explained, FIG. 8 is a schematic block diagram that shows one example of an exposure apparatus EX according to a fourth embodiment. In FIG. 8, the exposure apparatus EX comprises: a movable mask stage 1, which holds a mask M; a movable substrate stage 202, which holds a substrate P; an interferometer system 203, which is capable of measuring the position of the mask stage 201 and the substrate stage 202; an illumination system IL, which illuminates the mask M with exposure light EL; a projection optical system PL, which projects to the substrate P an image of a pattern of the mask M illuminated by the exposure light EL; and a control apparatus 204, which controls the operation of the entire exposure apparatus EX.

The mask M is a reticle on which a device pattern to be projected to the substrate P is formed. The mask M may be, for example, a transmissive mask wherein a light shielding film made of chrome and the like is used to form a prescribed pattern on a transparent plate, such as a glass plate. Furthermore, the mask M may alternatively be a reflective mask. The substrate P is a substrate for fabricating devices. The substrate P comprises a base material (e.g., a semiconductor wafer, such as a silicon wafer) whereon a photosensitive film is formed. The photosensitive film is made of a photosensitive material (e.g., photoresist). In addition, the substrate P may include a film other than the photosensitive film. For example, the substrate P may include an antireflection film or a protective film (i.e., a topcoat film) that protects the photosensitive film.

The exposure apparatus EX of the present embodiment is an immersion exposure apparatus that exposes the substrate P with the exposure light EL that passes through a liquid LQ. The exposure apparatus EX comprises a liquid immersion member 206, which is capable of forming an immersion space LS such that at least part of the optical path of the exposure light EL is filled with the liquid LQ. The immersion space LS is a space that is filled with the liquid LQ. In the present embodiment, water (i.e., pure water) is used as the liquid LQ.

In the present embodiment, the immersion space LS is formed such that the optical path of the exposure light EL emerging from a last optical element 205, which is the optical element of a plurality of optical elements of the projection optical system PL closest to the image plane of the projection optical system PL, is filled with the liquid LQ. The last optical element 205 has an emergent surface 209 wherefrom the exposure light EL emerges and travels toward the image plane of the projection optical system PL. The immersion space LS is formed such that the optical path between the last optical element 205 and an object, which opposes the emergent surface 209 of the last optical element 205, is filled with the liquid LQ. The position at which the object opposes the emergent surface 209 includes a position whereto the exposure light EL that emerges from the emergent surface 209 can be radiated.

The liquid immersion member 206 is disposed in the vicinity of the last optical element 205. The liquid immersion member 206 comprises a lower surface 207. In the present embodiment, the object capable of opposing the emergent surface 209 is also capable of opposing the lower surface 207. When the front surface of the object is disposed at a position at which it opposes the emergent surface 209, at least part of the lower surface 207 and the front surface of the object are opposed. When the emergent surface 209 and the front surface of the object are opposed, the last optical element 205 can hold the liquid LQ therebetween. In addition, when the lower surface 207 and the front surface of the object are opposed, the liquid immersion member 206 can hold the liquid LQ therebetween. The immersion space LS is formed by the liquid LQ that is held between the emergent surface 209 and the lower surface 207 on one side and the front surface of the object on the other side.

In the present embodiment, the object that is capable of opposing the emergent surface 205 and the lower surface 207 includes an object that is capable of moving on the emergent side (i.e., the image plane side of the projection optical system PL) of the last optical element 205, as well as an object that is capable of moving to the position at which it opposes the last optical element 209 and the lower surface 207. In the present embodiment, the object that is capable of opposing the last optical element 209 and the lower surface 207 is the substrate stage 202 or the substrate P held by the substrate stage 202, or both. Furthermore, to simplify the explanation, the following text principally explains an exemplary state wherein the substrate P opposes the last optical element 209 and the lower surface 207.

In the present embodiment, the immersion space LS is formed such that part of the area (i.e., a local area) of the front surface of the substrate P, which is disposed at a position at which it opposes the emergent surface 209 and the lower surface 207, is covered by the liquid LQ, and an interface LG (i.e., a meniscus or an edge) of the liquid LQ is formed between the front surface of the substrate P and the lower surface 207. Namely, the exposure apparatus EX of the present embodiment adopts a local liquid immersion system wherein the immersion space LS is formed such that the part of the area on the substrate P that includes a projection region PR of the projection optical system PL is covered with the liquid LQ during the exposure of the substrate P.

The illumination system IL illuminates a prescribed illumination region IR with the exposure light EL, which has a uniform luminous flux intensity distribution. The illumination region IR includes a position whereto the exposure light EL that emerges from the illumination system IL can be radiated. The illumination system IL illuminates at least part of the mask M disposed in the illumination region IR with the exposure light EL, which has a uniform luminous flux intensity distribution. Examples of light that can be used as the exposure light EL emitted from the illumination system IL include: deep ultraviolet (DUV) light, such as a bright line (i.e., g-line, h-line, or i-line) light emitted from, for example, a mercury lamp, and KrF excimer laser light (with a wavelength of 248 nm); and vacuum ultraviolet (VUV) light, such as ArF excimer laser light (with a wavelength of 193 nm) and $F_2$ laser light (with a wavelength of 157 nm). In the present embodiment, ArF excimer laser light, which is ultraviolet light (e.g., vacuum ultraviolet light), is used as the exposure light EL.

The mask stage 201 comprises a mask holding part 201H that releasably holds the mask M. In the present embodiment, the mask holding part 201H holds the mask M such that a patterned surface (i.e., a lower surface) of the mask M is substantially parallel to the XY plane. The mask stage 201 holds the mask M and is capable of moving within the XY plane by the operation of a first drive system 201D. The first drive system 201D comprises an actuator, such as a linear motor or a planar motor. In the present embodiment, in the state wherein the mask M is held by the mask holding part 201H, the mask stage 201 is capable of moving in three directions: the X axial, Y axial, and θZ directions.

The projection optical system PL radiates the exposure light EL to the prescribed projection area PR. The projection area PR includes a position whereto the exposure light EL that emerges from the projection optical system PL can be radiated. The projection optical system PL projects with a prescribed projection magnification an image of the pattern of the mask M to at least part of the substrate P, which is disposed in the projection area PR. A lens barrel PK holds the plurality of optical elements of the projection optical system PL. The projection optical system PL of the present embodiment is a reduction system that has a projection magnification of, for example, ¼, ⅕, or ⅛. Furthermore, the projection optical system PL may alternatively be a unity magnification system or an enlargement system. In the present embodiment, an optical axis AX of the projection optical system PL is substantially parallel to the Z axis. In addition, the projection optical system PL may be a dioptric system that does not include catoptric elements, a catoptric system that does not include dioptric elements, or a catadioptric system that includes both catoptric and dioptric elements. In addition, the projection optical system PL may form either an inverted or an erect image.

The substrate stage 202 is capable of moving on a guide surface 208G of a base member 208. In the present embodiment, the guide surface 208G is substantially parallel to the XY plane. The substrate stage 202 holds the substrate P and is capable of moving along the guide surface 208G within the XY plane. The substrate stage 202 is capable of moving to a position at which it opposes the emergent surface 209 of the last optical element 205.

The substrate stage 202 comprises a substrate holding part 202H, which releasably holds the substrate P. In the present embodiment, the substrate holding part 202H holds the substrate P such that the exposure surface (i.e., the front surface) of the substrate P is substantially parallel to the XY plane. The substrate stage 202 holds the substrate P and is capable of moving within the XY plane by the operation of a second drive system 202D. The second drive system 202D comprises an actuator, such as a linear motor or a planar motor. In the present embodiment, in the state wherein the substrate P is held by the substrate holding part 202H, the substrate stage 202 is capable of moving in six directions: the X, Y, and Z axial directions, and the θX, θY, and θZ directions.

The substrate stage 202 has an upper surface 202T, which is disposed around the substrate holding part 202H. In the present embodiment, the upper surface 202T is flat and substantially parallel to the XY plane. In addition, the substrate stage 202 has a recessed part 202C. The substrate holding part 202H is disposed on the inner side of the recessed part 202C. In the present embodiment, the upper surface 202T and the front surface of the substrate P held by the substrate holding part 202H are disposed in substantially the same plane (i.e., flush with one another).

The interferometer system 203 measures within the XY plane the positions of the mask stage 201 and the substrate stage 202. The interferometer system 203 comprises laser interferometers 203A, which measure the position of the mask stage 201, and laser interferometer 203B, which measure the position of the substrate stage 202. The laser interferometers 203A radiate measurement light beams to reflective surface 201R, which are disposed on the mask stage 201, and use the measurement light beams that transit the reflective surface 201R to measure the position of the mask stage 201 (i.e., the mask M) in the X axial, Y axial, and θZ directions. The laser interferometer 203B radiate measurement light beams to reflective surfaces 202R, which are disposed on the substrate stage 202, and use the measurement light beams that transit the reflective surfaces 202R to measure the position of the substrate stage 202 (i.e., the substrate P) in the X axial, Y axial, and θZ directions.

In addition, the present embodiment provides a focus and level detection system (not shown) that detects the position of the front surface of the substrate P held by the substrate stage 202. The focus and level detection system detects the position of the front surface of the substrate P in the Z axial, θX, and θY directions.

During an exposure of the substrate P, the laser interferometers 203A measure the position of the mask stage 201, the laser interferometer 203B measure the position of the substrate stage 202, and the focus and level detection system detects the position of the front surface of the substrate P. Based on the measurement results of the laser interferometers 203A, the control apparatus 204 controls the position of the mask M, which is held by the mask stage 201, by operating the first drive system 201D. In addition, based on the measurement results of the laser interferometer 203B and the detection results of the focus and level detection system, the control apparatus 204 controls the position of the substrate P held by the substrate stage 202 by operating the second drive system 202D.

The exposure apparatus EX of the present embodiment is a scanning type exposure apparatus (i.e., a so-called scanning stepper) that projects the image of the pattern of the mask M to the substrate P while synchronously moving the mask M and the substrate P in prescribed scanning directions. When the substrate P is exposed, the control apparatus 204 controls the mask stage 201 and the substrate stage 202 so as to move the mask M and the substrate P in the prescribed scanning directions within the XY plane that intersects the optical path (i.e., the optical axis AX) of the exposure light EL. In the present embodiment, the scanning directions (i.e., the synchronous movement directions) of both the substrate P and the mask M are the Y axial directions. The control apparatus 204 radiates the exposure light EL to the substrate P through the projection optical system PL and the liquid LQ in the immersion space LS on the substrate P while moving the substrate P in one of the Y axial directions with respect to the projection area PR of the projection optical system PL and moving the mask M, synchronized to the movement of the substrate P, in the other Y axial direction with respect to the illumination area IR of the illumination system IL. Thereby, the substrate P is exposed with the exposure light EL, and the image of the pattern of the mask M is projected to the substrate P.

Figure 9:
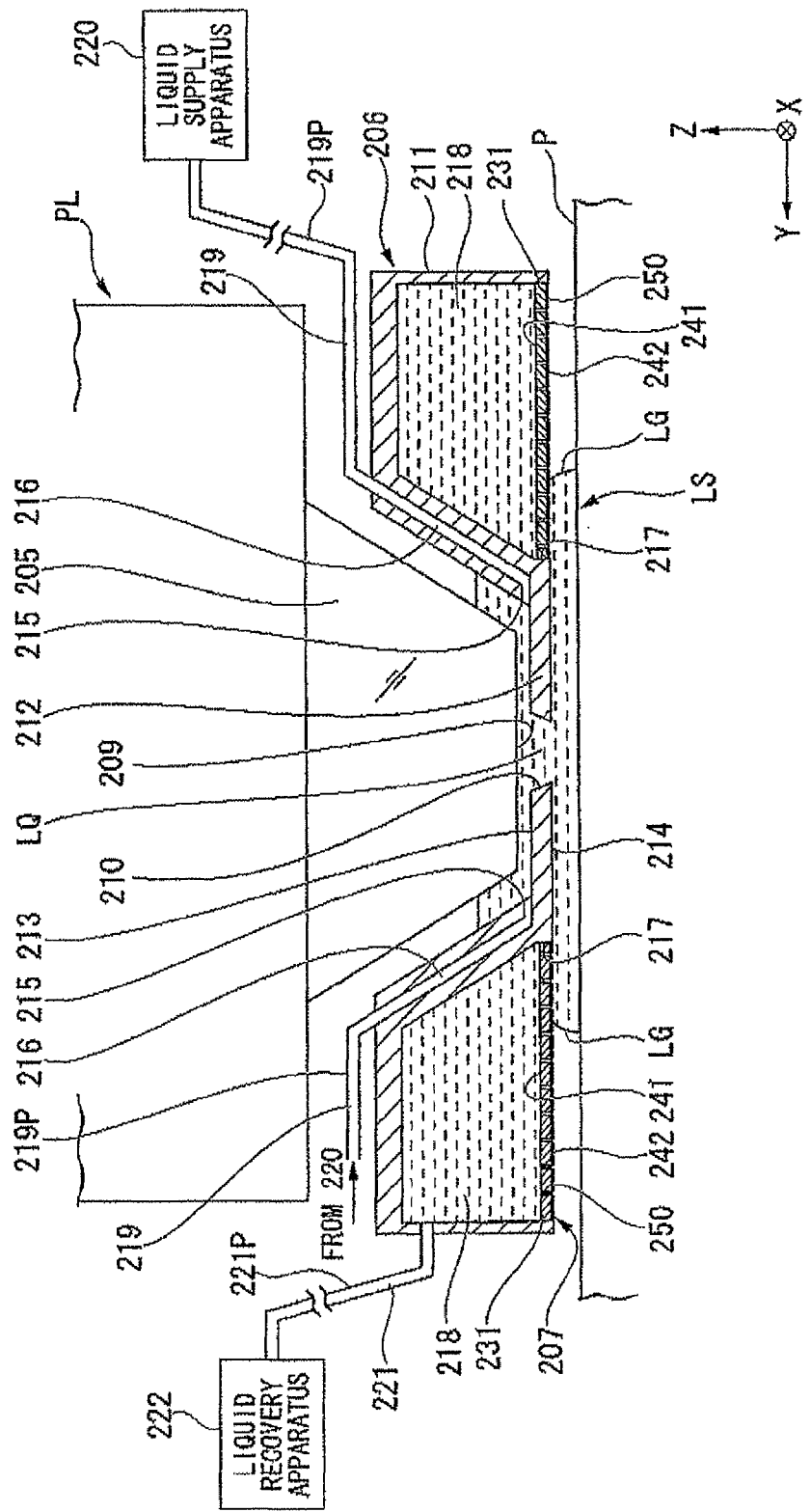
FIG. 9 is a side cross sectional view that shows the vicinity of a liquid immersion member according to the fourth embodiment.

The following text explains the liquid immersion member 206. FIG. 9 is a side cross sectional view that shows the vicinity of the liquid immersion member 206. Furthermore, the following text explains an exemplary case wherein the substrate P is disposed at a position at which it opposes the emergent surface 209 of the last optical element 205 as well as the lower surface 207 of the liquid immersion member 206; however, as discussed above, it is also possible to dispose an object other than the substrate P, such as the substrate stage 202, at a position at which it opposes the emergent surface 209 of the last optical element 205 as well as the lower surface 207 of the liquid immersion member 206.

The liquid immersion member 206 is disposed at least partly around the optical path of the exposure light EL and forms the immersion space LS such that the optical path of the exposure light EL between the last optical element 205 and the substrate P is filled with the liquid LQ. In the present embodiment, the liquid immersion member 206 is a ring shaped member and is disposed around the optical path of the exposure light EL. In the present embodiment, part of the liquid immersion member 206 is disposed around the last optical element 205. In the present embodiment, the liquid immersion member 206 comprises a main body part 211, which is disposed around the last optical element 205, and a plate part 212, at least part of which is disposed between the emergent surface 209 of the last optical element 205 and the front surface of the substrate P in the Z axial directions.

The plate part 212 has an opening 210, which is formed at a position at which it opposes the emergent surface 209. The exposure light EL that emerges from the emergent surface 209 can pass through the opening 210. For example, during an exposure of the substrate P, the exposure light EL that emerges from the emergent surface 209 passes through the opening 2010 and is radiated through the liquid LQ to the front surface of the substrate P.

The plate part 212 has an upper surface 213, which opposes part of the emergent surface 209, and a lower surface 214, which is capable of opposing the front surface of the substrate P. The upper surface 213 and the lower surface 214 are each disposed around the opening 210. Namely, the upper surface 213 and the lower surface 214 are each disposed around the optical path of the exposure light EL emerging from the emergent surface 209 of the last optical element 205.

In the present embodiment, the lower surface 207 of the liquid immersion member 206 includes the lower surface 214 of the plate part 212. The lower surface 214 is capable of holding the liquid LQ between itself and the front surface of the substrate P disposed at a position whereto the exposure light EL that emerges from the last optical element 205 can be radiated. The lower surface 214 is a flat surface. In the present embodiment, the lower surface 214 is substantially parallel to the front surface of the substrate P (i.e., to the XY plane).

In the present embodiment, the upper surface 213 and the lower surface 2014 are substantially parallel. In addition, the emergent surface 209 is substantially parallel to the upper surface 213 and the lower surface 214.

Furthermore, the lower surface 214 may be inclined with respect to the XY plane. In addition, the lower surface 214 and the emergent surface 209 may be nonparallel, the upper surface 213 and the emergent surface 209 may be nonparallel, and the upper surface 213 and the lower surface 214 may be nonparallel. In addition, at least part of the upper surface 213 may be a curved surface, and at least part of the lower surface 214 may be a curved surface. In addition, at least part of the emergent surface 209 may be a curved surface.

In the explanation below, the lower surface 214 is called the flat surface 214 where appropriate.

In addition, the liquid immersion member 206 has supply ports 215 and, connected thereto, supply passageways 216, both of which are for supplying the liquid LQ, as well as a recovery port 217 and, connected thereto, a recovery passageway 218, both of which are for recovering the liquid LQ.

The supply ports 215 are disposed at prescribed positions of the liquid immersion member 206 in the vicinity of the optical path of the exposure light EL such that the supply ports 215 face the optical path. In the present embodiment, the supply ports 215 are provided on opposite sides (one on each side) of the optical path in the Y axial directions. In the present embodiment, the supply ports 215 supply the liquid LQ to a space between the emergent surface 209 and the upper surface 213. The supply ports 215 supply, into the optical path of the exposure light EL, the liquid LQ for forming the immersion space LS.

Furthermore, the supply ports 215 may be provided on opposite sides of the optical path in the X axial directions as well as in both the X axial directions and the Y axial directions. In addition, the supply ports 215 may be provided at an arbitrary number of positions around the optical path. Furthermore, the supply ports 215 may be provided in the lower surface 207.

In the present embodiment, the recovery port 217 is disposed at a prescribed position in the liquid immersion member 206, which opposes the front surface of the substrate P. In the present embodiment, the recovery port 217 is disposed at least partly around the flat surface 214. In the present embodiment, the recovery port 217 is disposed continuously around the flat surface 214 (i.e., around the optical path of the exposure light EL). The recovery port 217 is capable of recovering the liquid LQ on the object opposing the lower surface 207 of the liquid immersion member 206.

The supply passageways 216 are formed inside the liquid immersion member 206. The supply ports 215 are connected to a liquid supply apparatus 220 via the supply passageways 216 and passageways 219 of a supply pipe 219P. The liquid supply apparatus 220 is capable of supplying the liquid LQ, which is clean and temperature adjusted. The liquid LQ supplied from the liquid supply apparatus 220 is supplied to the supply ports 215 through the passageways 219 and the supply passageways 216. The supply ports 215 supply the liquid LQ from the liquid supply apparatus 220 to the optical path of the exposure light EL.

The recovery passageway 218 is formed inside the liquid immersion member 206. The recovery port 217 is connected to a liquid recovery apparatus 222 via the recovery passageway 218 and a passageway 221 of a recovery pipe 221P. The liquid recovery apparatus 222 comprises a pressure adjusting apparatus and is capable of adjusting the pressure in the passageway 221 and the recovery passageway 218. In the present embodiment, the liquid recovery apparatus 222 is connected to a vacuum system, the passageway 221, and the recovery passageway 218, and is capable of adjusting the pressure in both the passageway 221 and the recovery passageway 218 to a prescribed negative pressure. The liquid recovery apparatus 222 can suction and recover the liquid LQ by negatively pressurizing the passageway 221 and the recovery passageway 218. The liquid LQ recovered via the recovery port 217 is recovered by the liquid recovery apparatus 222 through the recovery passageway 218 and the passageway 221.

Figure 10:
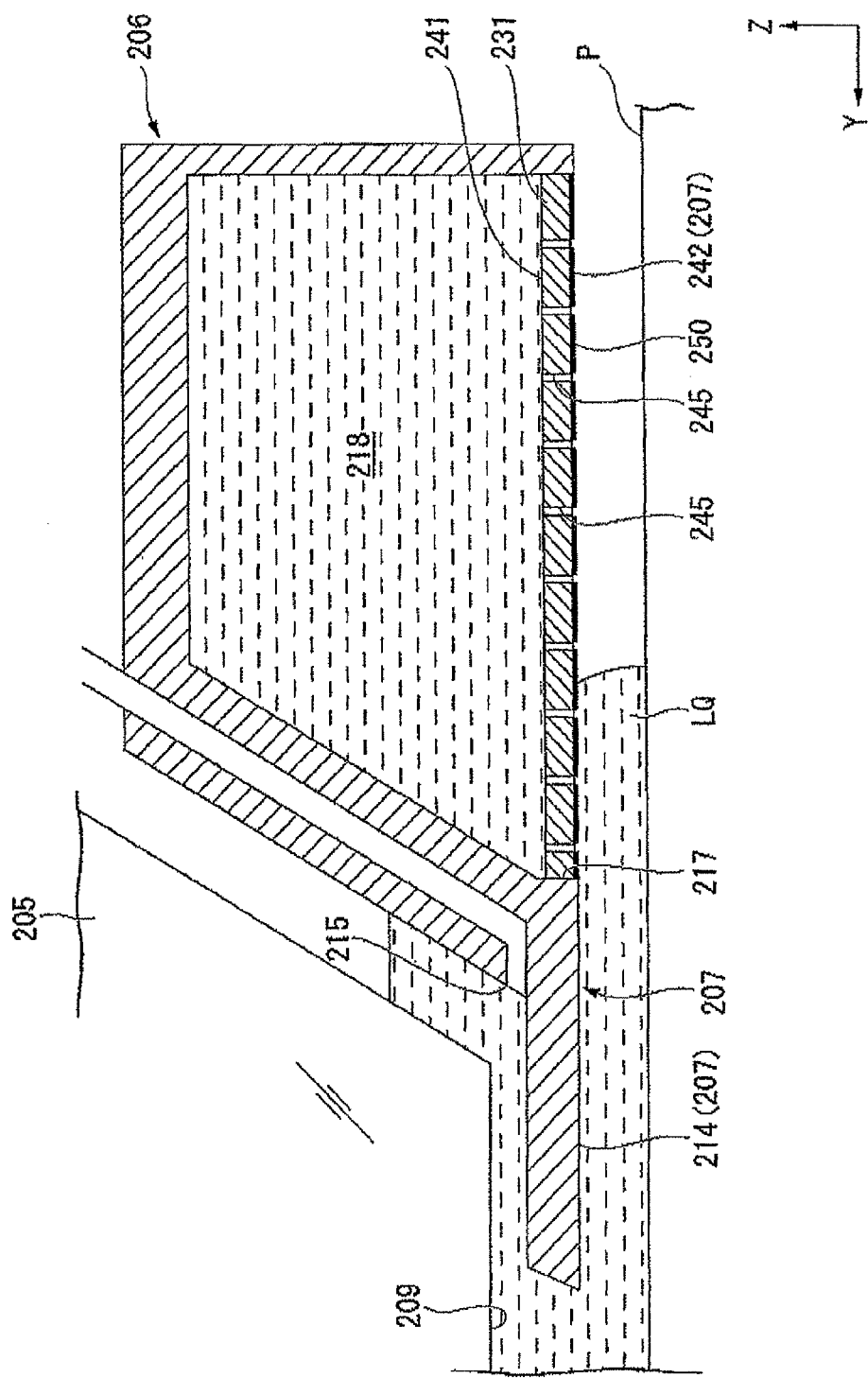
FIG. 10 is a side cross sectional view that shows part of the liquid immersion member according to the fourth embodiment.

FIG. 10 is a partial enlarged view of FIG. 9. In the present embodiment, a porous member 231 is disposed in the recovery port 217. The porous member 231 has a first surface 241, which is for recovering the liquid LQ and faces the recovery passageway 218, a second surface 242, which faces a direction other than that faced by the first surface 241, and a plurality of holes 245, which connect the first surface 241 and the second surface 242.

The porous member 231 is a plate shaped member wherein the plurality of small holes 245 is formed. The porous member 231 is made by fabricating a plate member (i.e., a base material) and forming the plurality of holes 245 therein and is also called a mesh plate. In the present embodiment, the porous member 231 is made of titanium. Furthermore, the porous member 231 may be made of stainless steel.

In the present embodiment, the first surface 241 faces the upward direction (i.e., the +Z direction) such that it faces the recovery passageway 218. The second surface 242 faces the direction opposite that faced by the first surface 241 (i.e., the −Z direction or the downward direction). Furthermore, in the present embodiment, the upward direction is parallel to the optical axis AX and is the opposite direction of that in which the exposure light EL travels. The downward direction is parallel to the optical axis AX and is the direction in which the exposure light EL travels.

In the present embodiment, the first surface 241 and the second surface 242 are substantially parallel. In the present embodiment, the first surface 241 and the second surface 242 are substantially parallel to the front surface of the substrate P (i.e., to the XY plane).

Furthermore, the first surface 241 and the second surface 242 may be nonparallel. In addition, the first surface 241 may be inclined with respect to the XY plane. Namely, the normal line of the first surface 241 may be nonparallel to the optical axis AX. In addition, the second surface 242 may be inclined with respect to the XY plane. In addition, at least part of the first surface 241 may be a curved surface and at least part of the second surface 242 may be a curved surface.

In the explanation below, the first surface 241 is called the upper surface 241 where appropriate, and the second surface 242 is called the lower surface 242 where appropriate.

In the present embodiment, the lower surface 242 of the porous member 231 is disposed at least partly around the flat surface 214. In the present embodiment, the lower surface 242 is disposed such that it surrounds the flat surface 214. In the present embodiment, the flat surface 214 and the lower surface 242 are formed within the same plane. In the present embodiment, the lower surface 207 of the liquid immersion member 206 includes the flat surface 214 and the lower surface 242.

Furthermore, the lower surface 242 may be disposed partly around the flat surface 214. For example, the lower surface 242 may be disposed partly on opposite sides of the optical path in the Y axial directions or in the X axial directions. In addition, the lower surface 242 may be provided at an arbitrary number of positions around the flat surface 214.

Each of the holes 245 is formed between, such that it passes through, the upper surface 241 and the lower surface 242. In the present embodiment, the holes 245 pass through the upper surface 241 and the lower surface 242 such that the holes 245 are substantially parallel to the Z axial directions. The liquid LQ is capable of circulating through the holes 245. The liquid LQ that flows to the openings of the holes 245 disposed in either the upper surface 241 or the lower surface 242 is capable of flowing out of the other opening of the relevant hole 245.

In the present embodiment, the lower surface 242 is [Translator's note: is probably should be may be] more liquid repellent with respect to the liquid LQ than is the upper surface 241 or the inner surfaces of the holes 245, or both. In the present embodiment, the lower surface 242 is more liquid repellent with respect to the liquid LQ than the upper surface 241 and the inner surfaces of the holes 245 are. The contact angle of the liquid LQ with respect to the lower surface 242 is, for example, 90° or greater. Moreover, the contact angle of the liquid LQ with respect to both the upper surface 241 and the inner surfaces of the holes 245 is smaller than 90°. In the present embodiment, the upper surface 241 and the inner surfaces of the holes 245 are lyophilic with respect to the liquid LQ.

In the present embodiment, the lower surface 242 is formed by a film 250 that is liquid repellent with respect to the liquid LQ. In the present embodiment, the material used to form the film 250 is fluorine based. In the present embodiment, the film 250 is a tetrafluoroethylene-perfluoro (alkyl vinyl ether) copolymer (PFA) film. Furthermore, the film 250 may also be a, for example, polytetrafluoroethylene (PTFE), polyetheretherketone (PEEK), or Teflon® film.

The upper surface 241 and the inner surfaces of the holes 245 are made of titanium. In the present embodiment, the contact angle of the liquid LQ with respect to the upper surface 241 and the contact angle of the liquid LQ with respect to the inner surfaces of the holes 245 are substantially equal. Furthermore, the contact angle of the liquid LQ with respect to the upper surface 241 and the contact angle of the liquid LQ with respect to the inner surfaces of the holes 245 may be different. In addition, the upper surface 241 or the inner surfaces of the holes 245, or both, may be a film formed from a material other than that of the film 250.

Furthermore, the porous member 231 may be formed from a material that is liquid repellent with respect to the liquid LQ, and the upper surface 241 or the inner surfaces of the holes 245, or both, may include a film that is more lyophilic than the lower surface 242 is.

In addition, in the present embodiment, the lower surface 242 is more liquid repellent with respect to the liquid LQ than the flat surface 214 is. In the present embodiment, the contact angle of the liquid LQ with respect to the flat surface 214 is smaller than 90°. In the present embodiment, the flat surface 214 is lyophilic with respect to the liquid LQ. In the present embodiment, the flat surface 214 is made of titanium. In the present embodiment, the plate part 212 is made of titanium, and the upper surface 213 and the flat surface 214 are made of titanium. Furthermore, the flat surface 214 may be made of, for example, stainless steel. In addition, the flat surface 214 may be a film formed from a material other than that of the film 250.

As shown in FIG. 9, in the present embodiment, when the liquid LQ on the substrate P is recovered, the recovery passageway 218 is filled with the liquid LQ and the upper surface 241 contacts the liquid LQ present in the recovery passageway 218. In addition, in the present embodiment, the control apparatus 204 adjusts the pressure in the recovery passageway 218 to a prescribed negative pressure by controlling the liquid recovery apparatus 222. In the present embodiment, the exposure apparatus EX is disposed in an internal space of a chamber apparatus (not shown), and that chamber apparatus adjusts the pressure in the internal space to substantially atmospheric pressure. Accordingly, in the present embodiment, the pressure between the lower surface 242 and the substrate P is substantially atmospheric pressure. The control apparatus 204 performs an adjustment such that the pressure in the recovery passageway 218 is lower than the pressure (i.e., atmospheric pressure) in the internal space wherein the liquid immersion member 206 is disposed.

By creating a pressure differential between the upper surface 241 and the lower surface 242 through operating the liquid recovery apparatus 222 to negatively pressurize the recovery passageway 218, the control apparatus 204 recovers at least some of the liquid LQ on the substrate P, which opposes the lower surface 242, via the porous member 231. The liquid LQ on the substrate P that contacts the lower surface 242 is recovered through the recovery passageway 218 via the holes 245 of the porous member 231. The liquid recovery apparatus 222 recovers via the passageway 221 the liquid LQ recovered via the recovery passageway 218.

In the present embodiment, the control apparatus 204 adjusts the pressure in the recovery passageway 218 by controlling the liquid recovery apparatus 222 such that only the liquid LQ is suctioned into the recovery passageway 218 via the porous member 231, namely, such that gas does not flow into the recovery passageway 218 via the porous member 231. The control apparatus 204 adjusts the pressure differential between the upper surface 241 and the lower surface 242 by adjusting the pressure in the recovery passageway 218 such that only the liquid LQ is suctioned into the recovery passageway 218.

The control apparatus 204 adjusts the pressure in the recovery passageway 218 in accordance with the liquid LQ and the porous member 231. For example, the pressure in the recovery passageway 218 is adjusted in accordance with the diameter of the holes 245 of the porous member 231, the contact angle of the liquid LQ with respect to the inner surfaces of the holes 245, the surface tension of the liquid LQ, and the like. The control apparatus 204 adjusts the pressure in the recovery passageway 218 in accordance with the liquid LQ and the porous member 231, which makes it possible to cause only the liquid LQ to flow into the recovery passageway 218 via the porous member 231. Furthermore, the technology for adjusting the pressure differential between the one side and the other side of the porous member, thereby causing only the liquid LQ to pass through the porous member from the one side to the other side thereof, is disclosed in U.S. Pat. No. 7,292,313 and PCT International Publication No. WO2006/106907.

The following text explains a method of using the exposure apparatus EX that has the abovementioned configuration to perform an immersion exposure on the substrate P.

To form the immersion space LS, the control apparatus 204 uses the supply ports 215 to supply the liquid LQ to the optical path of the exposure light EL emerging from the last optical element 205. When the liquid LQ is to be supplied, the control apparatus 204 disposes the object, such as the substrate P (i.e., the substrate stage 202), at a position at which it opposes the emergent surface 209 and the lower surface 207. The liquid LQ that is supplied from the liquid supply apparatus 220 is supplied to the supply ports 215 via the passageways 219 and the supply passageways 216. The supply ports 215 supply the liquid LQ to the space between the emergent surface 209 and the upper surface 213. The liquid LQ flows through the space between the emergent surface 209 and the upper surface 213, transits the opening 210, flows into the space between the lower surface 207 of the liquid immersion member 206 and the front surface of the substrate P, and is held between the lower surface 207 and the front surface of the substrate P. Thereby, the immersion space LS is formed such that the optical path of the exposure light EL between the emergent surface 209 of the last optical element 205, wherefrom the exposure light EL emerges, and the front surface of the substrate P, which opposes the emergent surface 209, is filled with the liquid LQ.

In addition, in the present embodiment, the control apparatus 204 forms the immersion space LS by performing the recovery operation, which recovers the liquid LQ via the recovery port 217, in parallel with the supply operation, which supplies the liquid LQ via the supply ports 215. At least some of the liquid LQ on the substrate P that contacts the lower surface 242 of the porous member 231 disposed in the recovery port 217 is recovered via the holes 245 of the porous member 231.

After the immersion space LS has been formed, the control apparatus 204 starts the exposure of the substrate P. The control apparatus 204 radiates the exposure light EL to the substrate P through the projection optical system PL and the liquid LQ on the substrate P while the substrate P moves in one of the Y axial directions with respect to the last optical element 205 and the liquid immersion member 206 in the state wherein the immersion space LS is formed by holding the liquid LQ between the emergent surface 209 and the lower surface 207 on one side and the front surface of the substrate P on the other side. Thereby, the image of the pattern of the mask M is projected to the substrate P, which is thereby exposed by the exposure light EL.

In the present embodiment, because the lower surface 242 of the porous member 231, which opposes the front surface of the substrate P, is liquid repellent with respect to the liquid LQ, the lower surface 242 is prevented from becoming contaminated.

For example, if the lower surface 242 were lyophilic with respect to the liquid LQ, then the lower surface 242 would more likely become contaminated. Furthermore, if the lower surface 242 were lyophilic with respect to the liquid LQ, then it would also mean that the contact angle of the liquid LQ with respect to the lower surface 242 would be smaller than 90°. In addition, if the lower surface 242 were lyophilic with respect to the liquid LQ, for example, either substances (e.g., organic substances such as the photosensitive material) discharged from the substrate P during the exposure of the substrate P and mixed with the liquid LQ in the immersion space LS as contaminants (i.e., foreign matter or particles) or contaminants that mix with the liquid LQ from the air (i.e., from the space wherein the liquid immersion member 206 is disposed) would more likely adhere to the lower surface 242, which makes contact with that liquid LQ. In addition, because the liquid LQ would tend to remain on the lower surface 242, foreign matter in the liquid LQ remaining on the lower surface 242 would also more likely adhere to the lower surface 242.

In the present embodiment, because the lower surface 242 is liquid repellent with respect to the liquid LQ, contaminants are prevented from adhering to the lower surface 242. Namely, because the lower surface 242 is liquid repellent, even if that surface contacts the liquid LQ, any contaminants present in that liquid LQ will be prevented from adhering to the lower surface 242.

In addition, even if contaminants did adhere to the lower surface 242, those contaminants would very likely separate from the lower surface 242 without remaining thereon and be recovered via the holes 245 of the porous member 231. Accordingly, contaminants are prevented from continuing to adhere to the lower surface 242 and from amassing (i.e., growing) on the lower surface 242. Accordingly, those contaminants are prevented from adhering to the front surface of the substrate P, adhering to the upper surface 202T of the substrate stage 202, and contaminating the liquid LQ supplied via the supply ports 215 and thereby moving along the optical path of the exposure light EL.

According to the present embodiment as explained above, the lower surface 242 of the porous member 231, which opposes the front surface of the substrate P, is liquid repellent with respect to the liquid LQ, which makes it possible to prevent the lower surface 242 from becoming contaminated. Consequently, it is possible to prevent, for example, contaminants (i.e., foreign matter) from adhering to the front surface of the substrate P or the upper surface 202T of the substrate stage 202 and to prevent the supplied liquid LQ from becoming contaminated. Accordingly, it is possible to prevent exposure failures from occurring and defective devices from being produced.

In addition, if the lower surface 207 of the liquid immersion member 206 includes a first area, which is in substantially continuous contact with the liquid LQ of the immersion space LS, a second area, which alternates between states of contact and non contact with the liquid LQ of the immersion space LS, and a third area, which for the most part does not contact the liquid LQ of the immersion space LS, then the second area or the third area, or both, would tend to become contaminated more than the first area would. In the present embodiment, the first area is more likely formed in the flat surface 214, and the second and third areas are more likely formed in the lower surface 42; however, because the lower surface 242 is more liquid repellent with respect to the liquid LQ than the flat surface 214 is, the lower surface 242 is prevented from becoming contaminated.

In addition, in the present embodiment, the inner surfaces of the holes 245 and the upper surface 241 are lyophilic with respect to the liquid LQ. Furthermore, because the inner surfaces of the holes 245 and the upper surface 241 are lyophilic with respect to the liquid LQ, it also means that the contact angle of the liquid LQ with respect to the inner surfaces of the holes 245 and the upper surface 241 is smaller than 90°. Because the inner surfaces of the holes 245 and the upper surface 241 are lyophilic with respect to the liquid LQ, the control apparatus 204, by adjusting the pressure in the recovery passageway 218, can smoothly suction only the liquid LQ into the recovery passageway 218 via the porous member 231.

According to the present embodiment, the inner surfaces of the holes 245 are lyophilic with respect to the liquid LQ, but they may be liquid repellent with respect to the liquid LQ. Namely, the inner surfaces of the holes 245 may be more liquid repellent with respect to the liquid LQ than the lower surface 242 is; alternatively, the inner surfaces of the holes 245 and the upper surface 242 may be substantially equally liquid repellent with respect to the liquid LQ.

In addition, the liquid LQ may flow, together with the gas, into the recovery passageway 218 via the porous member 231. In such a case, the upper surface 241, the lower surface 242, and the inner surfaces of the holes 245 may all be liquid repellent with respect to the liquid LQ.

<Fifth Embodiment>

The following text explains a fifth embodiment. In the explanation below, constituent parts that are identical or equivalent to those in the embodiment discussed above are assigned identical symbols, and the explanations thereof are therefore abbreviated or omitted.

Figure 11:
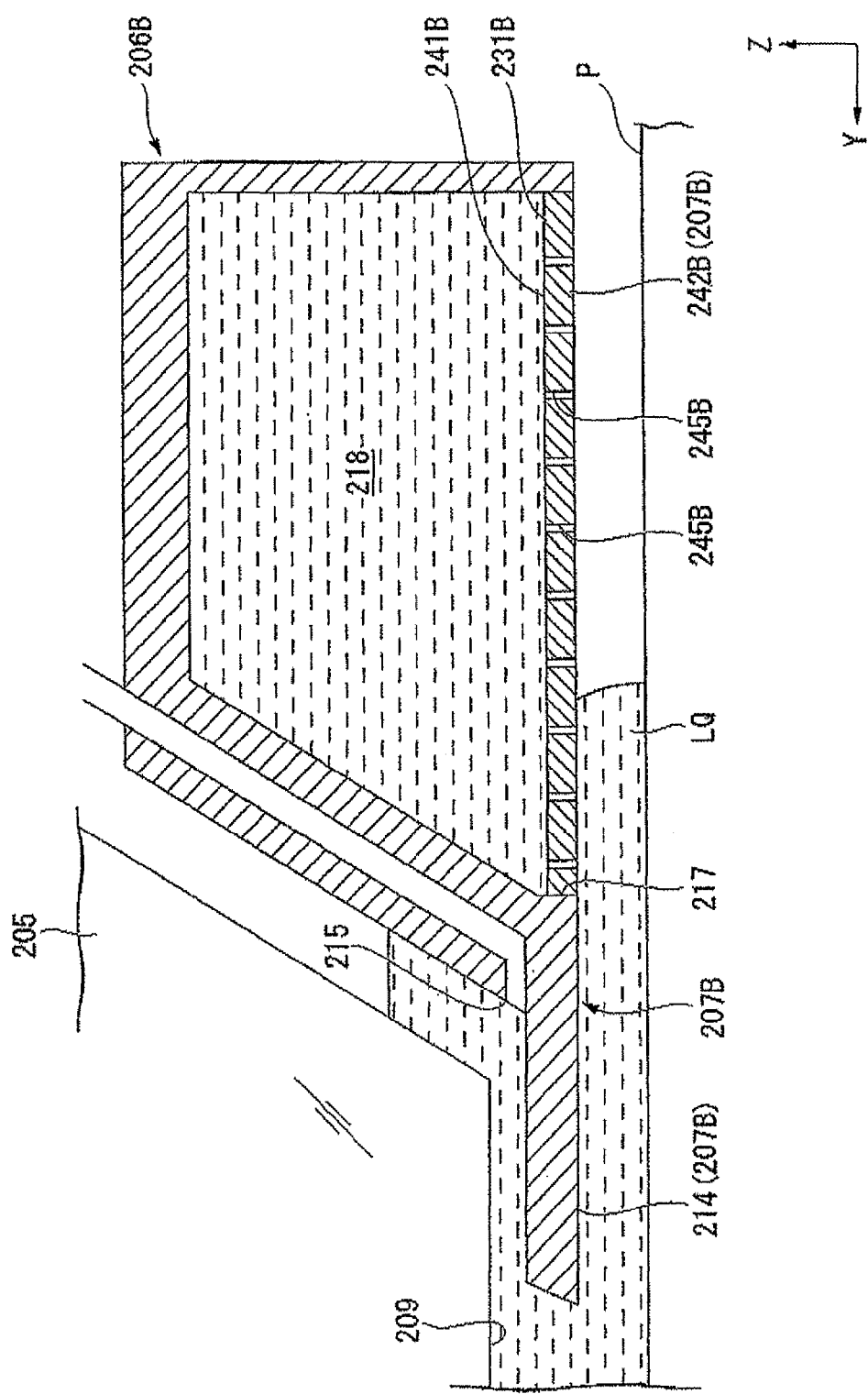
FIG. 11 is a side cross sectional view that shows part of the liquid immersion member according to a fifth embodiment.

FIG. 11 is a side cross sectional view that shows the vicinity of an immersion member 206B according to the fifth embodiment. As shown in FIG. 11, a porous member 231B is disposed in the recovery port 217. The porous member 231B has an upper surface 241B, which is for recovering the liquid LQ and faces the recovery passageway 218, a lower surface 242B, which faces a direction other than that faced by the upper surface 241B, and a plurality of holes 245B, which connects the upper surface 241B and the lower surface 242B. The porous member 231B is made of titanium. Furthermore, the porous member 231B may be made of stainless steel.

The lower surface 242B of the porous member 231 is disposed at least partly around the flat surface 214. In the present embodiment, the lower surface 242B is disposed such that it surrounds the flat surface 214. In the present embodiment, the flat surface 214 and the lower surface 242B are formed within the same plane. In the present embodiment, a lower surface 207B of the liquid immersion member 206 includes the flat surface 214 and the lower surface 242B. Furthermore, the lower surface 242B is disposed partly around the flat surface 214.

The holes 245B are formed between the upper surface 241B and the lower surface 242B such that they pass through the upper surface 241B and the lower surface 242B. The holes 245B are disposed between, such that they pass through, the upper surface 241B and the lower surface 242B substantially parallel to the Z axial directions.

In the present embodiment, the roughness of the lower surface 242B is lower than that of the upper surface 241B or the inner surfaces of the holes 245B of the porous member 231B, or both. In the present embodiment, the roughness of the lower surface 242B is lower than that of the upper surface 241B and the inner surfaces of the holes 245B.

Furthermore, the roughness of the lower surface 242B may be lower than that of the upper surface 241B and higher than that of the inner surfaces of the holes 245B. In addition, the roughness of the lower surface 242B may be higher than that of the upper surface 241B and lower than that of the inner surfaces of the holes 245B.

In the present embodiment, the lower surface 242B is mirror polished. The liquid LQ on the substrate P opposing the lower surface 242B is recovered via the holes 245B of the porous members 231B.

According to the present embodiment as explained above, because the roughness of the lower surface 242B of the porous member 231B opposing the front surface of the substrate P is sufficiently low, the lower surface 242B from can be prevented from becoming contaminated. Namely, because the roughness of the lower surface 242B is sufficiently low, contaminants (i.e., foreign matter) in the liquid LQ are prevented from adhering to the lower surface 242B. In addition, even if contaminants did adhere to the lower surface 242B, those contaminants would very likely separate from the lower surface 242B without remaining thereon and be recovered via the holes 245B of the porous member 231B. Consequently, the lower surface 242B is prevented from becoming contaminated. Accordingly, in the present embodiment, too, it is possible to prevent exposure failures from occurring and defective devices from being produced.

In addition, in the present embodiment, too, the lower surface 242B can be made more liquid repellent with respect to the liquid LQ than is the upper surface 241B or the inner surfaces of the holes 245B, or both. For example, the lower surface 242B can be made more liquid repellent with respect to the liquid LQ than the upper surface 241B and the inner surfaces of the holes 245B are. For example, the lower surface 242B may be formed from a liquid repellent film; furthermore, the upper surface 241B or the inner surfaces of the holes 245B, or both, may be formed from a film for adjusting the contact angle of the liquid LQ. Doing so can better prevent the lower surface 242B from becoming contaminated.

In addition, in the present embodiment, the lower surface 242B can be made more liquid repellent with respect to the liquid LQ than the flat surface 214 is. In addition, in the present embodiment, too, the liquid LQ may flow, together with the gas, into the recovery passageway 218 via the porous member 231.

<Sixth Embodiment>

The following text explains a sixth embodiment. In the explanation below, constituent parts that are identical or equivalent to those in the embodiments discussed above are assigned identical symbols, and the explanations thereof are therefore abbreviated or omitted.

Figure 12:
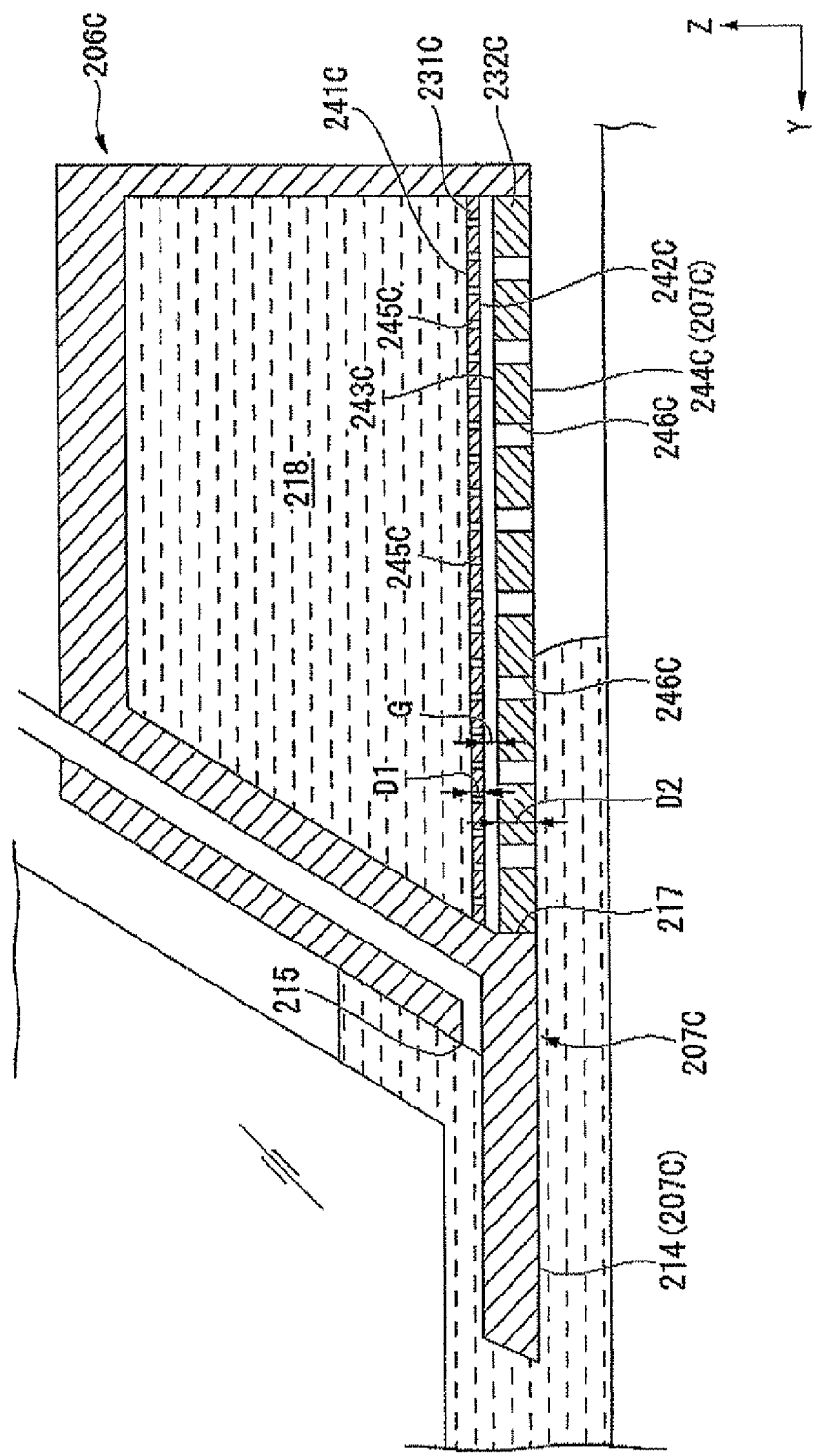
FIG. 12 is a side cross sectional view that shows part of the liquid immersion member according to a sixth embodiment.

FIG. 12 is a side cross sectional view that shows the vicinity of a liquid immersion member 206C according to the sixth embodiment. As shown in FIG. 12, in the present embodiment, a first porous member 231C is disposed between the recovery port 217 and the recovery passageway 218, and a second porous member 232C is disposed in the recovery port 217. The first porous member 231C has an upper surface 241C, which faces the recovery passageway 218, a lower surface 242C, which faces a direction other than that faced by the upper surface 241C, and a plurality of holes 245C, which connects the upper surface 241C and the lower surface 242C. The second porous member 232C has an upper surface 243C, which opposes the second surface 242C of the first porous member 231C across a gap G, a lower surface 244C, which faces a direction other than that faced by the upper surface 243C, and a plurality of holes 246C, which connects the upper surface 243C and the lower surface 244C.

The first porous member 231C is a plate shaped member wherein the plurality of small holes 245C is formed. The second porous member 232C is a plate shaped member wherein the plurality of small holes 246C is formed. In the present embodiment, the first porous member 231C and the second porous member 232C are made of titanium. Furthermore, the first porous member 231C or the second porous member 232C, or both, may be made of stainless steel. In addition, the first porous member 231C and the second porous member 232C may be made of different materials.

In the present embodiment, the upper surface 241C faces the upward direction (i.e., the +Z direction) such that it faces the recovery passageway 218. The lower surface 242C faces the direction opposite that faced by the upper surface 241C (i.e., the −Z direction or the downward direction). In the present embodiment, the upper surface 241C and the lower surface 242C are substantially parallel. In the present embodiment, the upper surface 241C and the lower surface 242C are substantially parallel to the front surface of the substrate P (i.e., to the XY plane).

In the present embodiment, the upper surface 243C faces the upward direction (i.e., the +Z direction) such that it opposes the lower surface 242C. The lower surface 244C faces the direction opposite that faced by the upper surface 243C (i.e., the −Z direction or the downward direction). In the present embodiment, the upper surface 243C and the lower surface 244C are substantially parallel. In the present embodiment, the upper surface 243C and the lower surface 244C are substantially parallel to the front surface of the substrate P (i.e., to the XY plane).

Furthermore, the upper surface 241C and the lower surface 242C may be nonparallel. In addition, the upper surface 241C may be inclined with respect to the XY plane, and the lower surface 242C may be inclined with respect to the XY plane. In addition, at least part of the upper surface 241C may be a curved surface, and at least part of the lower surface 242C may be a curved surface. In addition, the upper surface 243C and the lower surface 244C may be nonparallel. In addition, the lower surface 242C and the upper surface 243C may be nonparallel. In addition, the upper surface 243C may be inclined with respect to the XY plane, and the lower surface 244C may be inclined with respect to the XY plane. In addition, at least part of the upper surface 243C may be a curved surface, and at least part of the lower surface 244C may be a curved surface.

In the present embodiment, the lower surface 244C of the second porous member 232C is disposed at least partly around the flat surface 214. In the present embodiment, the lower surface 244C is disposed such that it surrounds the flat surface 214. In the present embodiment, the flat surface 214 and the lower surface 244C are formed within the same plane. In the present embodiment, a lower surface 207C of the liquid immersion member 206C includes the flat surface 214 and the lower surface 244C. Furthermore, the lower surface 244C is disposed partly around the flat surface 214.

The holes 245C are formed between the upper surface 241C and the lower surface 242C such that they pass through the upper surface 241C and the lower surface 242C. The holes 246C are formed between the upper surface 243C and the lower surface 244C such that they pass through the upper surface 243C and the lower surface 244C.

In the present embodiment, the roughness of the lower surface 244C is lower than that of the upper surface 241C, the lower surface 242C, or the upper surface 243C, or any combination thereof. In the present embodiment, the roughness of the lower surface 244C is lower than that of the upper surface 241C, the lower surface 242C, and the upper surface 243C.

In addition, in the present embodiment, the roughness of the lower surface 244C is lower than that of the inner surfaces of the holes 245C of the first porous member 231C or the inner surfaces of the holes 246C of the second porous member 232C, or both. In the present embodiment, the roughness of the lower surface 244C is lower than that of the inner surfaces of the holes 245C and the inner surfaces of the holes 246C. In the present embodiment, the roughness of the lower surface 244C is lower than that of the upper surface 241C, the lower surface 242C, the upper surface 243C, the inner surfaces of the holes 245C, and the inner surfaces of the holes 246C.

In the present embodiment, the lower surface 244C is mirror polished. In addition, in the present embodiment, the upper surface 241C, the lower surface 242C, and the upper surface 243C are not mirror polished. Furthermore, the upper surface 241C, the lower surface 242C, or the upper surface 243C, or any combination thereof, may be mirror polished.

In addition, in the present embodiment, a distance D2 between the upper surface 243C and the lower surface 244C is greater than a distance D1 between the upper surface 241C and the lower surface 242C. The distance D1 between the upper surface 241C and the lower surface 242C is the thickness of the first porous member 231C. The distance D2 between the upper surface 243C and the lower surface 244C is the thickness of the second porous member 232C. Namely, in the present embodiment, the thickness D2 of the second porous member 232C is greater (i.e., thicker) than the thickness D1 of the first porous member 231C.

Figure 13:
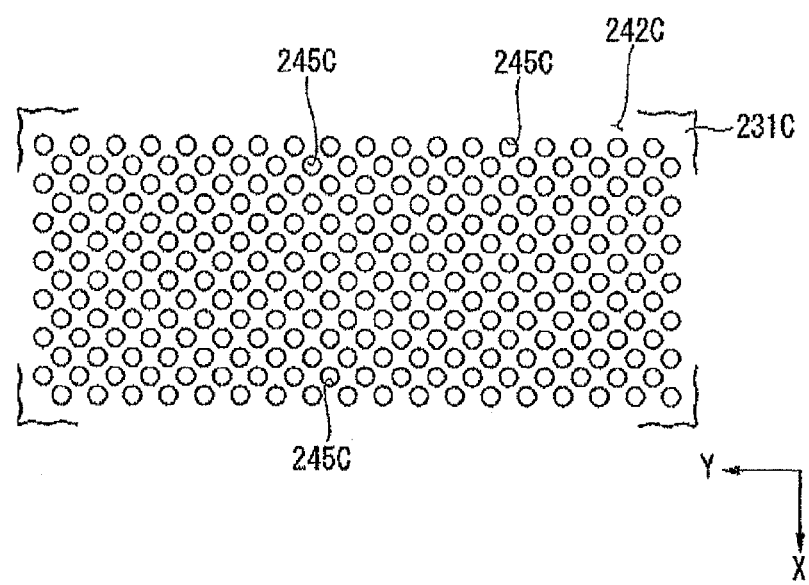
FIG. 13 is a plan view that shows part of a first porous member according to the sixth embodiment.
Figure 14:
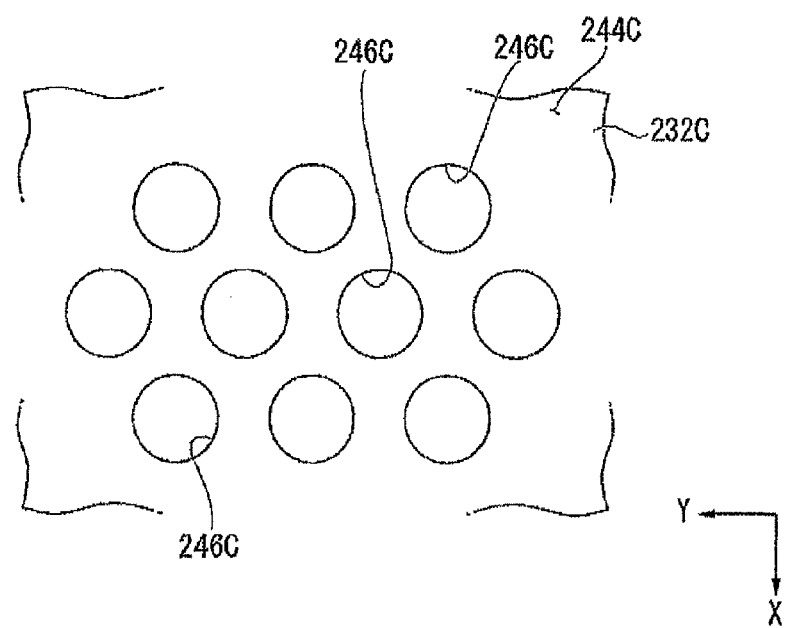
FIG. 14 is a plan view that shows part of a second porous member according to the sixth embodiment.

FIG. 13 is a plan view that shows one example of the first porous member 231C, and FIG. 14 is a plan view that shows one example of the second porous member 232C. As shown in FIG. 13 and FIG. 14, in the present embodiment, the size (i.e., the diameter) of the holes 245C of the first porous member 231C is less than that of the holes 246C of the second porous member 232C. Furthermore, not all of the holes 245C have to be the same size, and not all of the holes 246C have to be the same size. In addition, the fact that the diameter of the holes 245C of the first porous member 231C is smaller than that of the holes 246C of the second porous member 232C does not necessarily mean that all of the holes 245C of the first porous member 231C must be smaller than the holes 246C of the second porous member 232C. For example, the above includes the case wherein the average diameter of the holes 245C of the first porous member 231C is smaller than that of the holes 246C of the second porous member 232C. Alternatively, the above also includes the case wherein the diameter of the smallest of the holes 245C of the first porous member 231C is smaller than the diameter of the smallest of the holes 246C of the second porous member 232C.

In addition, in the present embodiment, the number of holes 245C per unit of area in the lower surface 242C (i.e., the upper surface 241C) is greater than the number of the holes 246C per unit of area in the lower surface 244C (i.e., the upper surface 243C).

Furthermore, in the present embodiment, the holes 245C, 246C within the XY plane have a circular shape. Furthermore, the holes 245C, 246C within the XY plane may have a shape other than circular, for example, polygonal such as pentagonal or hexagonal. In addition, the holes 245C and the holes 246C may have different shapes.

In the present embodiment, when the liquid LQ on the substrate P is recovered, the recovery passageway 218 is filled with the liquid LQ and the upper surface 241C contacts the liquid LQ present in the recovery passageway 218. In addition, in the present embodiment, the control apparatus 204 adjusts the pressure in the recovery passageway 218 to a prescribed negative pressure by controlling the liquid recovery apparatus 222. In the present embodiment, the exposure apparatus EX is disposed in an internal space of a chamber apparatus (not shown), and that chamber apparatus adjusts the pressure in the internal space to substantially atmospheric pressure. Accordingly, in the present embodiment, the pressure between the lower surface 244C and the substrate P is substantially atmospheric pressure. The control apparatus 204 performs an adjustment such that the pressure in the recovery passageway 218 is lower than the pressure (i.e., atmospheric pressure) in the internal space.

By operating the liquid recovery apparatus 222 to negatively pressurize the recovery passageway 218 and thereby create a pressure differential between the upper surface 241C and the lower surface 242C, namely, by creating a pressure differential between the upper surface 241C and the lower surface 244C, the control apparatus 204 recovers at least some of the liquid LQ on the substrate P opposing the lower surface 244C via the first porous member 231C and the second porous member 232C. Namely, by creating a pressure differential between the upper surface 241C and the lower surface 242C, the control apparatus 204 can cause the liquid LQ that contacts the lower surface 244C to flow via the holes 246C into the space between the first porous member 231C and the second porous member 232C. The liquid LQ that contacts the lower surface 242C between the first porous member 231C and the second porous member 232C flows into the recovery passageway 218 via the holes 245C of the first porous member 231C. Furthermore, the liquid LQ may fill the space between the first porous member 231C and the second porous member 232C; furthermore, the space formed by the liquid LQ and the space formed by the gas may overlap.

Thus, in the present embodiment, the liquid LQ on the substrate P opposing the lower surface 244C flows into the space between the first porous member 231C and the second porous member 232C via the holes 246C of the second porous member 232C. The liquid LQ that flows into the space between the first porous member 231C and the second porous member 232C and contacts the lower surface 242C is recovered through the recovery passageway 218 via the holes 245C of the first porous member 231C. The liquid recovery apparatus 222 recovers through the passageway 221 the liquid LQ recovered via the recovery passageway 218.

In the present embodiment, the control apparatus 204 adjusts the pressure in the recovery passageway 218 by controlling the liquid recovery apparatus 222 such that only the liquid LQ is suctioned into the recovery passageway 218 via the first porous member 231C.

The control apparatus 204 adjusts the pressure in the recovery passageway 218 in accordance with the liquid LQ and the first porous member 231C. For example, by adjusting the pressure in the recovery passageway 218 in accordance with the diameter of the holes 245C of the first porous member 231C, the contact angle of the liquid LQ with respect to the inner surfaces of the holes 245C, the surface tension of the liquid LQ, and the like, the control apparatus 204 can cause only the liquid LQ to flow into the recovery passageway 218 via the first porous member 231C.

According to the present embodiment as explained above, it is possible to recover the liquid LQ on the object (i.e., the substrate P) via the holes 246C of the second porous member 232C and the holes 245C of the first porous member 231C while preventing the first porous member 231C, which faces the recovery passageway 218, from becoming contaminated. In the present embodiment, the first porous member 231 is more spaced apart from the front surface of the object (i.e., the substrate P) than is the lower surface 207 of the liquid immersion member 206; therefore, for example, substances produced by the substrate P are prevented from adhering to the first porous member 231C. Furthermore, because the second porous member 232C is disposed between the first porous member 231C and the front surface of the object (i.e., the substrate P), for example, substances produced by the substrate P are prevented from adhering to the lower surface 242C of the first porous member 231C. Accordingly, it is possible to prevent the object (i.e., the substrate P) from becoming contaminated, the liquid LQ that forms the immersion space LS from becoming contaminated, and the like owing to the contamination of the first porous member 231C.

In addition, in the present embodiment, because the holes 246C of the second porous member 232C are larger than the holes 245C of the first porous member 231C and the roughness of the lower surface 244C of the second porous member 232C is sufficiently low, the second porous member 232C is prevented from becoming contaminated (i.e., foreign matter is prevented from adhering to the second porous member 232C). Accordingly, the object (i.e., the substrate P) opposing the second porous member 232C is prevented from becoming contaminated, the liquid LQ in the immersion space LS is prevented from becoming contaminated, and the like owing to the contamination of the second porous member 232C.

In the present embodiment, the size, layout, and number of the holes 245C of the first porous member 231C, the liquid repellency of the inner surfaces of the holes 245C with respect to the liquid LQ, and the like are determined such that only the liquid LQ flows into the recovery passageway 218 via the first porous member 231C.

Accordingly, by preventing the first porous member 231C from becoming contaminated, the liquid recovery performance of the first porous member 231C is maintained. In addition, because the second porous member 232C is disposed at a position at which it can be easily maintained (i.e., cleaned or replaced), the second porous member 232C can be maintained easily if the second porous member 232C becomes contaminated.

In addition, in the present embodiment, the thickness D1 of the first porous member 231C is less than the thickness D2 of the second porous member 232C. Thereby, processes (i.e., fabrication) needed to form the holes 245C can be performed smoothly. Namely, if the plate member that constitutes the base material of the first porous member 231C is thin, then the processes that form the numerous small holes 245C in the plate member can be performed more smoothly than would be the case were the plate member thick.

In addition, because the holes 245C in the first porous member 231C can be made small, the control apparatus 204, by adjusting the pressure in the recovery passageway 218, can cause only the liquid LQ to be suctioned smoothly into the recovery passageway 218 via the first porous member 231. Namely, were the holes 245C of the first porous member 231C large, it might become difficult to suction only the liquid LQ into the recovery passageway 218. According to the present embodiment, the small holes 245C can be formed smoothly in the thin plate member, which constitutes the base material of the first porous member 231C, and the liquid LQ alone can be suctioned smoothly into the recovery passageway 218 via the small holes 245C of the first porous member 231C. In addition, making the number of the holes 245C per unit area in the lower surface 242C large makes it possible to cause the liquid LQ that flows into the space between the first porous member 231C and the second porous member 232C via the holes 246C of the second porous member 232C to flow smoothly into the recovery passageway 218 via the holes 245C of the first porous member 231C.

In addition, in the present embodiment, the thickness D2 of the second porous member 232C is greater than the thickness D1 of the first porous member 231C. Thereby, the processes (i.e., fabrication) needed to decrease the roughness of the lower surface 244C can be performed smoothly. Namely, if the lower surface 244C is to be mirror polished, performing that mirror polishing smoothly might be difficult if the thickness D2 of the second porous member 232C is small. According to the present embodiment, the thickness D2 of the second porous member 232C is greater than at least the thickness D1 of the first porous member 231C, which makes it possible to smoothly mirror polish the second porous member 232C.

The present embodiment as discussed above has a structure wherein the holes 245C of the first porous member 231C are relatively small and tend to become contaminated; however, because the second porous member 232C, whose structure tends not to become contaminated more than the first porous member 231C does, is disposed between the first porous member 231C and the object (i.e., the substrate P), the first porous member 231C can prevent the object (i.e., the substrate P) from becoming contaminated, the liquid LQ that forms the immersion space LS from becoming contaminated, and the like. In addition, it is also possible to prevent the object (i.e., the substrate P) opposing the second porous member 232C from becoming contaminated, the liquid LQ that forms the immersion space LS from becoming contaminated, and the like owing to the contamination of the second porous member 232C. In addition, although the first porous member 231C is disposed spaced apart from the object (i.e., the substrate P), the lower surface 244C of the second porous member 232C, which tends not to become contaminated, is disposed such that it contacts the front surface of the object (i.e., the substrate P), which makes it possible to prevent the liquid LQ from leaking out of the space between the lower surface 207C of the liquid immersion member 206 and the front surface of the object (i.e., the substrate P) because the liquid LQ (i.e., the interface LG of the immersion space LS) is prevented from moving between the lower surface 244C and the object (i.e., the substrate P). In addition, in the present embodiment, the lower surface 244C and the flat surface 214 are coplanar, which prevents contaminants (i.e., foreign matter) from adhering to the lower surface 207C of the liquid immersion member 206C (e.g., the boundary portion between the lower surface 244C and the flat surface 214). Of course, the lower surface 244C and the flat surface 214 do not have to be coplanar.

Furthermore, in the present embodiment, too, the lower surface 244C can be made more liquid repellent with respect to the liquid LQ than is the upper surface 241C, the lower surface 242C, or the upper surface 243C, or any combination thereof. For example, the lower surface 244c can be made more liquid repellent than the upper surface 241C, the lower surface 242C, and the upper surface 243C are.

In addition, in the present embodiment, the lower surface 244C can be made more liquid repellent with respect to the liquid LQ than are the inner surfaces of the holes 245C of the first porous member 231C or the inner surfaces of the holes 246C of the second porous member 232C, or both. For example, the lower surface 244C can be made more liquid repellent with respect to the liquid LQ than are the inner surfaces of the holes 245C and the inner surfaces of the holes 246C.

In addition, in the present embodiment, the lower surface 244C can be made more liquid repellent with respect to the liquid LQ than the flat surface 214 is.

Making the lower surface 244C liquid repellent with respect to the liquid LQ can much better prevent the lower surface 244C from becoming contaminated.

Furthermore, by forming the lower surface 244C with a liquid repellent film, the lower surface 244C may be made liquid repellent, and the upper surface 241C, the lower surface 242C, the upper surface 243C, the inner surfaces of the holes 245C, or the inner surfaces of the holes 246C, or any combination thereof, may be formed with a film that adjusts the contact angle of the liquid LQ.

Furthermore, in the present embodiment, the liquid LQ may flow, together with the gas, into the recovery passageway 218 via the first porous member 231C.

In addition, in the present embodiment, the first porous member 231C and the second porous member 232C may have the same structure. Namely, the size, layout, or thickness, or any combination thereof, of the holes may be the same for both the first porous member 231C and the second porous member 232C.

Furthermore, in the first, second, and sixth embodiments discussed above, the porous member (231, 231B, 231C, 232C) is not limited to a mesh plate and may be a mesh filter, which is a porous member that comprises a combination of members, a plurality of holes being formed in each member, and wherein numerous small holes are formed in a mesh or a honeycomb configuration. In addition, a sintered member (e.g., sintered metal) wherein numerous holes (i.e., pores) are formed, a foam member (e.g., metal foam), or the like may be used as the porous member (231, 231B, 231C, 232C).

In addition, in each of the embodiments discussed above, the flat surface 214 may be disposed at least partly around the emergent surface 209 and the porous member (231, 231B, 231C, 232C) may be disposed at least partly around the flat surface 214. In this case, the flat surface 214 may be disposed at the same height as or above (i.e., on the +Z side of) the emergent surface 209.

In addition, in the first, second, and sixth embodiments discussed above, a liquid immersion member disclosed in PCT International Publication No. WO2008/143357 can also be used as the liquid immersion member (206, 206B, 206C).

Furthermore, in the projection optical system PL in each of the embodiments discussed above, the optical path on the emergent side (i.e., the image plane side) of the last optical element 205 is filled with the liquid LQ, but it is also possible to adopt a projection optical system wherein the optical path on the incident side (i.e., the object plane side) of the last optical element 205 is also filled with the liquid LQ, as disclosed in PCT International Publication WO2004/019128.

Furthermore, although the liquid LQ in the embodiments discussed above is water, it may be a liquid other than water. It is preferable to use as the liquid LQ a liquid that is transparent to the exposure light EL, has as high a refractive index as possible, and is stable with respect to the projection optical system or the film of the photosensitive material (i.e., the photoresist) that forms the front surface of the substrate. For example, it is also possible to use hydro-fluoro-ether (HFE), perfluorinated polyether (PFPE), Fomblin® oil, cedar oil, or the like as the liquid LQ. In addition, a liquid that has a refractive index of approximately 1.6 to 1.8 may be used as the liquid LQ. In addition, it is also possible to use various fluids, for example, a supercritical fluid, as the liquid LQ.

Furthermore, the substrate P in each of the embodiments discussed above is not limited to a semiconductor wafer for fabricating semiconductor devices, but can also be adapted to, for example, a glass substrate for display devices, a ceramic wafer for thin film magnetic heads, or the original plate of a mask or a reticle (e.g., synthetic quartz or a silicon wafer) used by an exposure apparatus.

In addition to a step-and-scan system scanning type exposure apparatus (i.e., a scanning stepper) that scans and exposes the pattern of the mask M by synchronously moving the mask M and the substrate P, a step-and-repeat type projection exposure apparatus (i.e., a stepper) that exposes the full pattern of the mask M, with the mask M and the substrate P in a stationary state, and sequentially steps the substrate P can also be adapted to the exposure apparatus EX.

Furthermore, when performing an exposure with a step-and-repeat system, the projection optical system is used to transfer a reduced image of a first pattern to the substrate P in a state wherein the first pattern and the substrate P are substantially stationary, after which the projection optical system may be used to perform a full-field exposure of the substrate P, wherein a reduced image of a second pattern partially superposes the first pattern in a state wherein the second pattern and the substrate P are substantially stationary (i.e., as in a stitching type full-field exposure apparatus). In addition, the stitching type exposure apparatus can also be adapted to a step-and-stitch type exposure apparatus that successively steps the substrate P and transfers at least two patterns onto the substrate P such that they are partially superposed.

In addition, the present invention can also be adapted to, for example, an exposure apparatus that combines the patterns of two masks onto a substrate through a projection optical system and double exposes, substantially simultaneously, a single shot region on the substrate using a single scanning exposure, as disclosed in, for example, U.S. Pat. No. 6,611,316. In addition, the present invention can also be adapted to, for example, a proximity type exposure apparatus and a mirror projection aligner.

In addition, the present invention can also be adapted to a twin stage type exposure apparatus, which comprises a plurality of substrate stages, as disclosed in, for example, U.S. Pat. Nos. 6,341,007, 6,400,441, 6,549,269, 6,590,634, 6,208,407, and 6,262,796.

Furthermore, as disclosed in, for example, corresponding U.S. Pat. No. 6,897,963, the present invention can also be adapted to an exposure apparatus provided with both a substrate stage that holds the substrate and a measurement stage whereon either a fiducial member (wherein a fiducial mark is formed) or various photoelectric sensors, or both, are mounted. In addition, the present invention can also be adapted to an exposure apparatus that comprises a plurality of the substrate stages and the measurement stages. Disposing the measurement stage at a position at which it opposes an emergent surface of the last optical element and a lower surface of the liquid immersion member makes it possible to form the immersion space between the measurement stage on one side and the last optical element and the liquid immersion member on the other side.

The type of exposure apparatus EX is not limited to semiconductor device fabrication exposure apparatuses that expose the substrate P with the pattern of a semiconductor device, but is also widely applicable to, for example, exposure apparatuses for fabricating liquid crystal devices or displays and exposure apparatuses for fabricating thin film magnetic heads, image capturing devices (CCDs), micromachines, MEMS, DNA chips, reticles and masks, and the like.

Furthermore, in each of the embodiments discussed above, the positions of the mask stage 1 (201) and the substrate stage 2 (202) are measured using the interferometer system 3 (203) that comprises the laser interferometers 3A, 3B (203A, 203B), but the present invention is not limited thereto; for example, an encoder system may be used that detects a scale (i.e., a diffraction grating) provided to each of the stages 1, 2 (201, 202). In this case, a hybrid system that comprises both the interferometer system and the encoder system may also be adopted.

In addition, in each of the embodiments discussed above, an ArF excimer laser may be used as a light source apparatus that generates ArF excimer laser light, which serves as the exposure light EL; however, as disclosed in, for example, U.S. Pat. No. 7,023,610, a harmonic generation apparatus that outputs pulsed light with a wavelength of 193 nm and that comprises an optical amplifier part—which has a solid state laser light source (such as a DFB semiconductor laser or a fiber laser), a fiber amplifier, and the like—and a wavelength converting part may be used. Furthermore, in the abovementioned embodiments, both the illumination area and the projection area discussed above are rectangular, but they may be some other shape, for example, arcuate.

Furthermore, in each of the embodiments discussed above, an optically transmissive mask wherein a prescribed shielding pattern (or phase pattern or dimming pattern) is formed on an optically transmissive substrate is used; however, instead of such a mask, a variable shaped mask (also called an electronic mask, an active mask, or an image generator), wherein a transmissive pattern, a reflective pattern, or a light emitting pattern is formed based on electronic data of the pattern to be exposed, as disclosed in, for example, U.S. Pat. No. 6,778,257 may be used. The variable shaped mask comprises, for example, a digital micromirror device (DMD), which is one kind of non-emissive type image display device (e.g., a spatial light modulator). In addition, instead of a variable shaped mask that comprises a non-emissive type image display device, a pattern forming apparatus that comprises a self-luminous type image display device may be provided. Examples of a self-luminous type image display device include a cathode ray tube (CRT), an inorganic electroluminescence display, an organic electroluminescence display (OLED: organic light emitting diode), an LED display, a laser diode (LD) display, a field emission display (FED), and a plasma display panel (PDP).

Each of the embodiments discussed above explained an exemplary case of the exposure apparatus that comprises the projection optical system PL, but the present invention can be adapted to an exposure apparatus and an exposing method that do not use the projection optical system PL. Thus, even if the projection optical system PL is not used, the exposure light can be radiated to the substrate through optical members, such as lenses, and the immersion space can be formed in a prescribed space between the substrate and those optical members.

In addition, by forming interference fringes on the substrate P as disclosed in, for example, PCT International Publication No. WO2001/035168, the present invention can also be adapted to an exposure apparatus (i.e., a lithographic system) that exposes the substrate P with a line-and-space pattern.

As described above, the exposure apparatus EX is manufactured by assembling various subsystems, including each constituent element, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes, for example, the connection of mechanical components, the wiring and connection of electrical circuits, and the piping and connection of the pneumatic circuits among the various subsystems. Naturally, prior to performing the process of assembling the exposure apparatus from these various subsystems, there are also the processes of assembling each individual subsystem. When the process of assembling the exposure apparatus from the various subsystems is complete, a comprehensive adjustment is performed to ensure the various accuracies of the exposure apparatus as a whole. Furthermore, it is preferable to manufacture the exposure apparatus in a clean room wherein, for example, the temperature and the cleanliness level are controlled.

Figure 15:
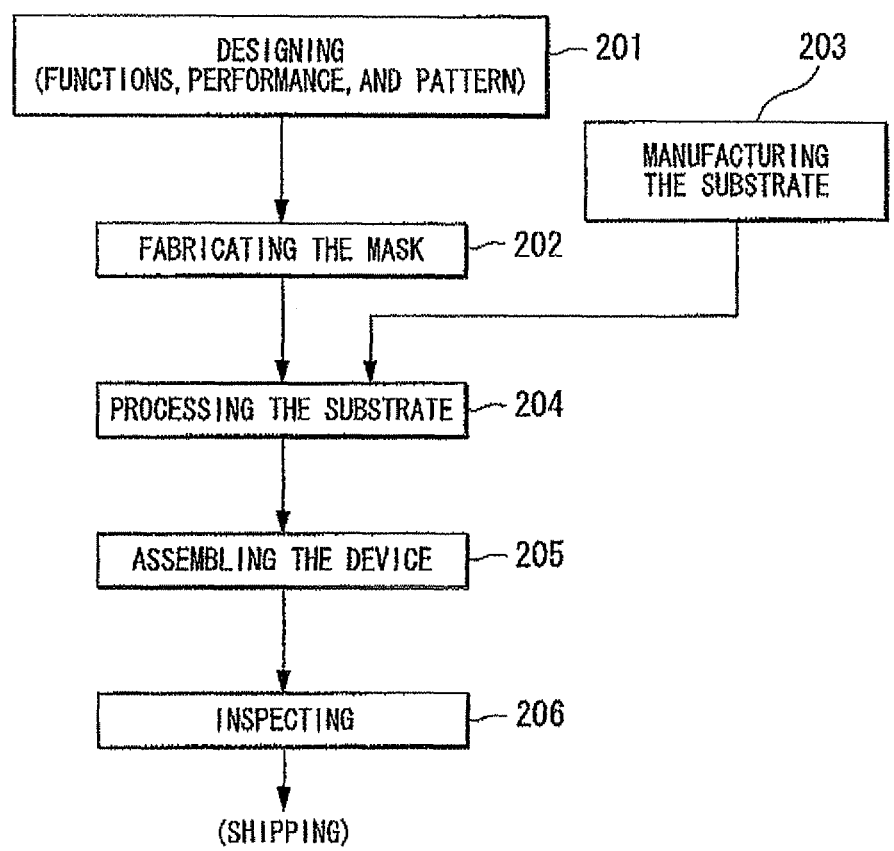
FIG. 15 is a flow chart that depicts one example of a process for fabricating a microdevice.

As shown in FIG. 15, a microdevice, such as a semiconductor device, is manufactured by: a step 201 that designs the functions and performance of the microdevice; a step 202 that fabricates a mask (i.e., a reticle) based on this designing step; a step 203 that manufactures a substrate, which is the base material of the device; a substrate processing step 204 that comprises a substrate process (i.e., an exposure process) that includes, in accordance with the embodiments discussed above, exposing the substrate with the exposure light using the mask pattern and developing the exposed substrate; a device assembling step 205 (which includes fabrication processes such as dicing, bonding, and packaging processes); an inspecting step 206; and the like.

Furthermore, the features of each of the embodiments discussed above can be combined as appropriate. In addition, each disclosure of every Japanese published patent application and U.S. patent related to the exposure apparatus recited in each of the embodiments, modified examples, and the like discussed above is hereby incorporated by reference in its entirety to the extent permitted by national laws and regulations.

What is claimed is:

1. A liquid immersion member which is disposed around an optical member having an emergent surface from at least part of which exposure light is emitted and which holds an immersion liquid between itself and an object opposing the emergent surface so that an optical path of exposure light between the emergent surface and the object is filled with the immersion liquid to form an immersion space, the liquid immersion member comprising:
- an opening that recovers the immersion liquid on the object with a gas;
- a space into which the immersion liquid and the gas from the opening are entered;
- a recovery portion having a first recovery port located above the opening and a recovery passageway, the recovery portion configured to collect the immersion liquid in the space into the recovery passageway via the first recovery port;
- an opposing surface that opposes an outer surface of the optical member with a gap therebetween;
- a second recovery port that faces the gap and recovers at least part of a liquid in the gap;
- a first supply port that faces the gap and supplies the immersion liquid; and
- a second supply port that faces the space and supplies fluid to the space not through the opening.

2. The liquid immersion member according to claim 1, wherein the second recovery port is also capable of recovering the immersion liquid supplied from the first supply port.

3. The liquid immersion member according to claim 1, further comprising a third supply port that is capable of supplying a gas to the gap.

4. The liquid immersion member according to claim 3, wherein the gas supplied from the third supply port has been humidified.

5. The liquid immersion member according to claim 1, wherein the second supply port supplies a liquid to the space.

6. The liquid immersion member according to claim 1, further comprising: a lower surface that is disposed at least partly around the opening,
- wherein the lower surface comprises a surface of a fluorinated material.

7. The liquid immersion member according to claim 1, further comprising:
- a liquid contact surface that is disposed around an optical path of the exposure light emitted from the emergent surface, the object is capable of opposing the liquid contact surface,
- wherein the opening is disposed at least partly around the liquid contact surface.

8. The liquid immersion member according to claim 1, further comprising:
- a first porous member having a plurality of holes,
- wherein the opening comprises the holes of the first porous member.

9. The liquid immersion member according to claim 1,
- wherein the first recovery port includes a plurality of holes of a second porous member, and
- wherein the second porous member allows only a liquid in the space to enter into the recovery passage.

10. The liquid immersion member according to claim 1, wherein the first recovery port includes a plurality of holes of a second porous member.

11. A device manufacturing method comprising:
- exposing a substrate using a liquid exposure apparatus defined in claim 10; and
- developing the exposed substrate.

12. A liquid immersion exposure apparatus comprising:
- a projection system; and
- a liquid immersion member defined in claim 1,
- wherein a substrate is exposed through an immersion liquid in a liquid immersion space formed using the liquid immersion member.

13. A exposure method comprising:
- forming a liquid immersion space using a liquid immersion member defined claim 1 such that an immersion liquid covers only a portion of a surface of a substrate; and
- exposing the substrate through the immersion liquid of the liquid immersion space.

14. A liquid immersion member which holds a liquid between an emergent surface of an optical member from which exposure light is emitted and an object facing the emergent surface so that an optical path of exposure light between the emergent surface and the object is filled with a liquid to form an immersion space, the liquid immersion member comprising:
- a fist porous member;
- a space into which a liquid on the object together with a gas is entered via the first porous member which is located above the object;
- a recovery passage into which a liquid from the space is entered; and
- a second porous member that is located above the first porous member and that allows substantially only a liquid from the space to enter into the recovery passage.

* * * * *